United States Patent
Glenn et al.

(10) Patent No.: US 10,566,272 B2
(45) Date of Patent: Feb. 18, 2020

(54) MOLDED BODY AND ELECTRICAL DEVICE HAVING A MOLDED BODY FOR HIGH VOLTAGE APPLICATIONS

(71) Applicant: VISHAY DALE ELECTRONICS, LLC, Columbus, NE (US)

(72) Inventors: Darin Glenn, Columbus, NE (US); Scott Blackburn, Temperance, MI (US)

(73) Assignee: VISHAY DALE ELECTRONICS, LLC, Columbus, NE (US)

( * ) Notice: Subject to any disclaimer, the term of this patent is extended or adjusted under 35 U.S.C. 154(b) by 0 days.

(21) Appl. No.: 15/864,337

(22) Filed: Jan. 8, 2018

(65) Prior Publication Data

US 2018/0261533 A1    Sep. 13, 2018

Related U.S. Application Data

(63) Continuation of application No. 15/229,556, filed on Aug. 5, 2016, now Pat. No. 9,865,532.

(60) Provisional application No. 62/202,580, filed on Aug. 7, 2015.

(51) Int. Cl.
  *H01L 23/31* (2006.01)
  *H01L 23/495* (2006.01)

(52) U.S. Cl.
  CPC .... *H01L 23/49589* (2013.01); *H01L 23/3107* (2013.01); *H01L 23/49562* (2013.01)

(58) Field of Classification Search
  CPC .......... H01L 23/3114; H01L 23/49562; H01L 23/49589
  See application file for complete search history.

(56) References Cited

U.S. PATENT DOCUMENTS

| | | |
|---|---|---|
| 696,757 A | 4/1902 | Rypinski |
| 779,737 A | 1/1905 | Robinson |
| 859,255 A | 7/1907 | Roller |
| 3,238,489 A | 3/1966 | Hay |
| 3,795,046 A | 3/1974 | Shim |
| 4,159,459 A | 6/1979 | Sease et al. |
| 4,906,802 A | 3/1990 | Castleman |
| 5,173,766 A | 12/1992 | Long et al. |
| 5,194,935 A | 3/1993 | Kitano et al. |
| 5,444,304 A | 8/1995 | Hara et al. |
| 5,446,623 A | 8/1995 | Kanetake |
| 5,481,241 A | 1/1996 | Caddock, Jr. |
| 5,582,240 A | 12/1996 | Widmayer |

(Continued)

FOREIGN PATENT DOCUMENTS

| | | |
|---|---|---|
| JP | 2006108721 A | 4/2006 |
| JP | 2009-038275 A | 2/2009 |

(Continued)

OTHER PUBLICATIONS

International Standard, IEC/CEI 60664-1:2007, Basic Safety Publication, Second Edition Apr. 2007 (cover page and pp. 27-28).

*Primary Examiner* — Errol V Fernandes
(74) *Attorney, Agent, or Firm* — Volpe and Koenig, P.C.

(57) ABSTRACT

An electrical device comprising a ribbed molded body housing an electrical component is provided. The ribbed molded body includes at least one surface or portion having a plurality of ribs along at least a portion of the surface. The electrical component may be a passive or active electrical component. The electrical component may be connected to a lead frame and molded into the ribbed molded body.

20 Claims, 25 Drawing Sheets

(56) References Cited

U.S. PATENT DOCUMENTS

| | | |
|---|---|---|
| 5,604,477 A | 2/1997 | Rainer et al. |
| 5,709,960 A | 1/1998 | Mays et al. |
| 6,181,234 B1 | 1/2001 | Szwarc et al. |
| 6,195,256 B1 | 2/2001 | Tiziani et al. |
| 6,392,208 B1 | 5/2002 | Arx |
| 6,432,344 B1 | 8/2002 | Eckman et al. |
| 6,576,995 B2 | 6/2003 | Högerl et al. |
| 6,617,685 B1 | 9/2003 | Bollesen |
| 6,680,015 B2 | 1/2004 | McCullough |
| 7,119,447 B2 | 10/2006 | Larking |
| 7,190,068 B2 | 3/2007 | Hackitt et al. |
| 7,311,140 B2 | 12/2007 | McCullough |
| 7,316,755 B2 | 1/2008 | Ito et al. |
| 7,476,702 B2 | 1/2009 | Sagal et al. |
| 7,671,455 B2 | 3/2010 | Pavier |
| D613,258 S | 4/2010 | Walker et al. |
| 7,763,970 B2 | 7/2010 | Tschirbs et al. |
| 7,843,309 B2 | 11/2010 | Zandman et al. |
| 8,414,338 B2 | 4/2013 | Reibke et al. |
| 8,575,767 B1 | 11/2013 | Zommer |
| 8,678,863 B2 | 3/2014 | Nagata et al. |
| 8,837,168 B2 | 9/2014 | Chen et al. |
| 9,001,512 B2 | 4/2015 | Smith et al. |
| 9,601,850 B2 | 3/2017 | Best et al. |
| 9,646,755 B2 | 5/2017 | Lint |
| 9,672,972 B2 | 6/2017 | Takiguchi et al. |
| 2003/0052386 A1 | 3/2003 | Yamaguchi |
| 2003/0116552 A1 | 6/2003 | Santoruvo et al. |
| 2006/0197648 A1 | 9/2006 | Smith et al. |
| 2006/0231945 A1 | 10/2006 | Chinthakindi et al. |
| 2007/0108388 A1 | 5/2007 | Lane et al. |
| 2007/0120060 A1 | 5/2007 | Lane et al. |
| 2007/0205503 A1 | 9/2007 | Baek et al. |
| 2007/0262845 A1 | 11/2007 | Takagi et al. |
| 2008/0102584 A1 | 5/2008 | Kerr et al. |
| 2008/0310167 A1 | 12/2008 | Zaderej et al. |
| 2009/0154111 A1 | 6/2009 | Lynch |
| 2010/0328021 A1 | 12/2010 | Hirasawa et al. |
| 2011/0063071 A1 | 3/2011 | Zandman et al. |
| 2017/0040239 A1 | 2/2017 | Glenn |

FOREIGN PATENT DOCUMENTS

| | | |
|---|---|---|
| JP | 2014192283 A | 10/2014 |
| TW | 379276 B | 1/2000 |

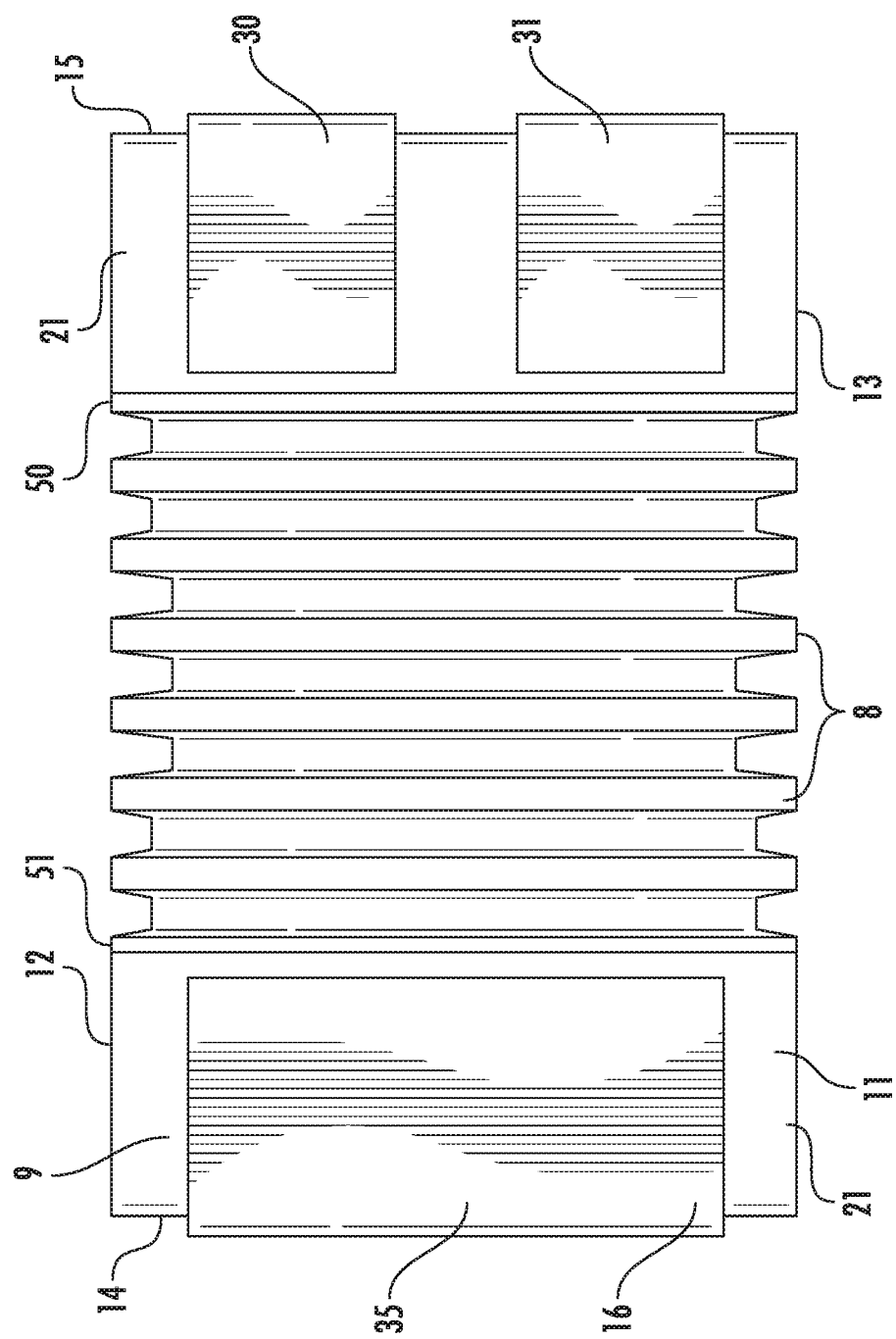

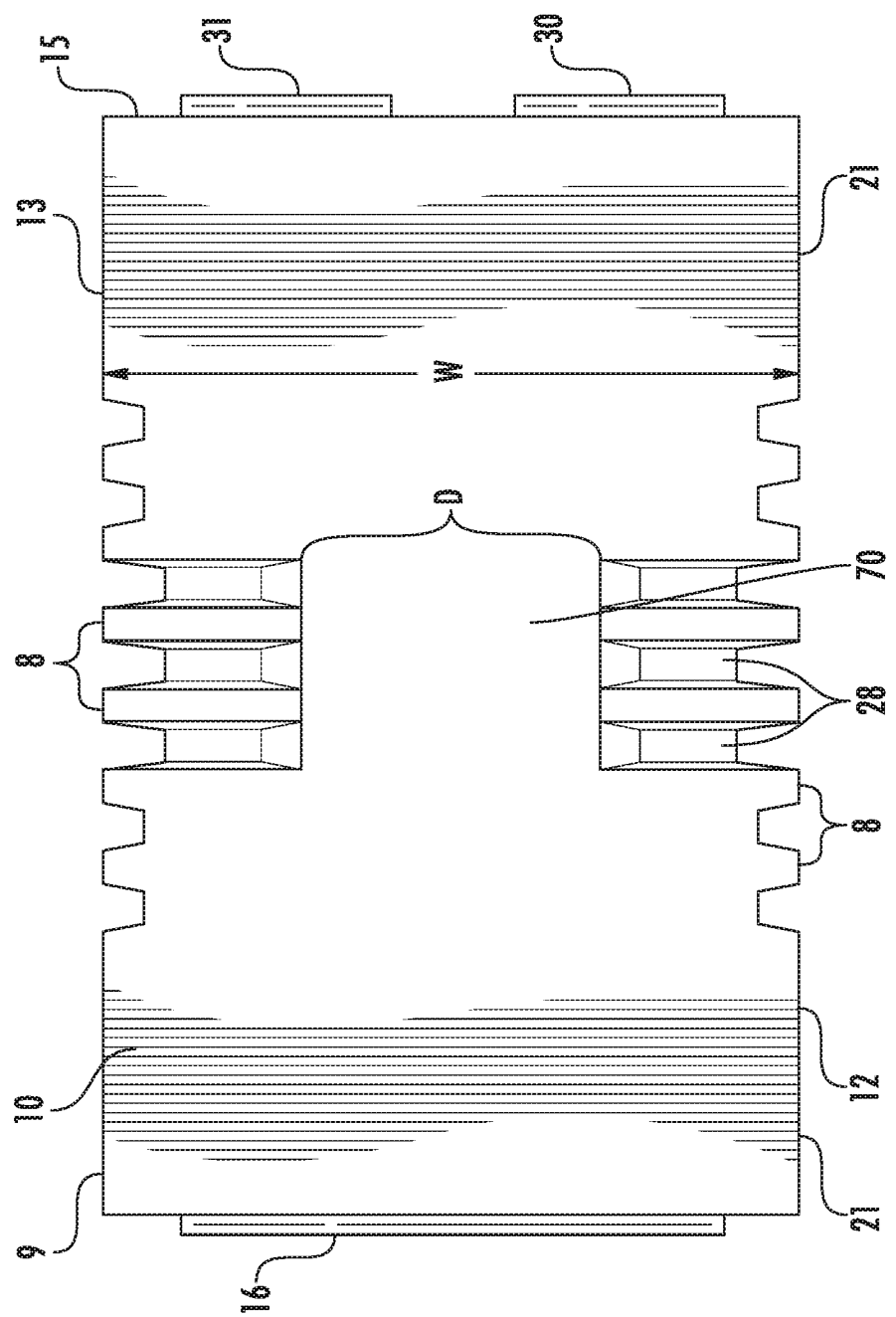

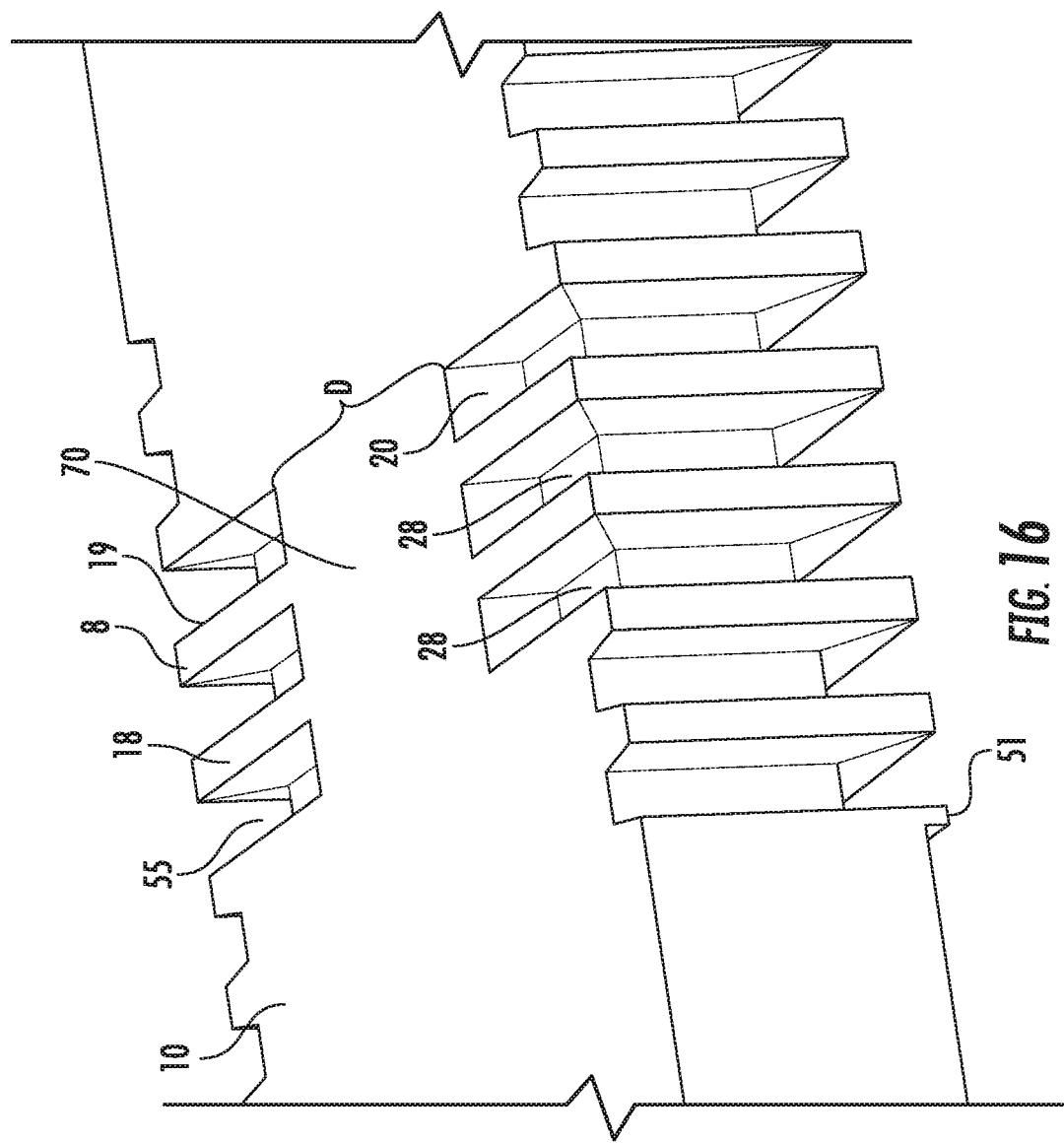

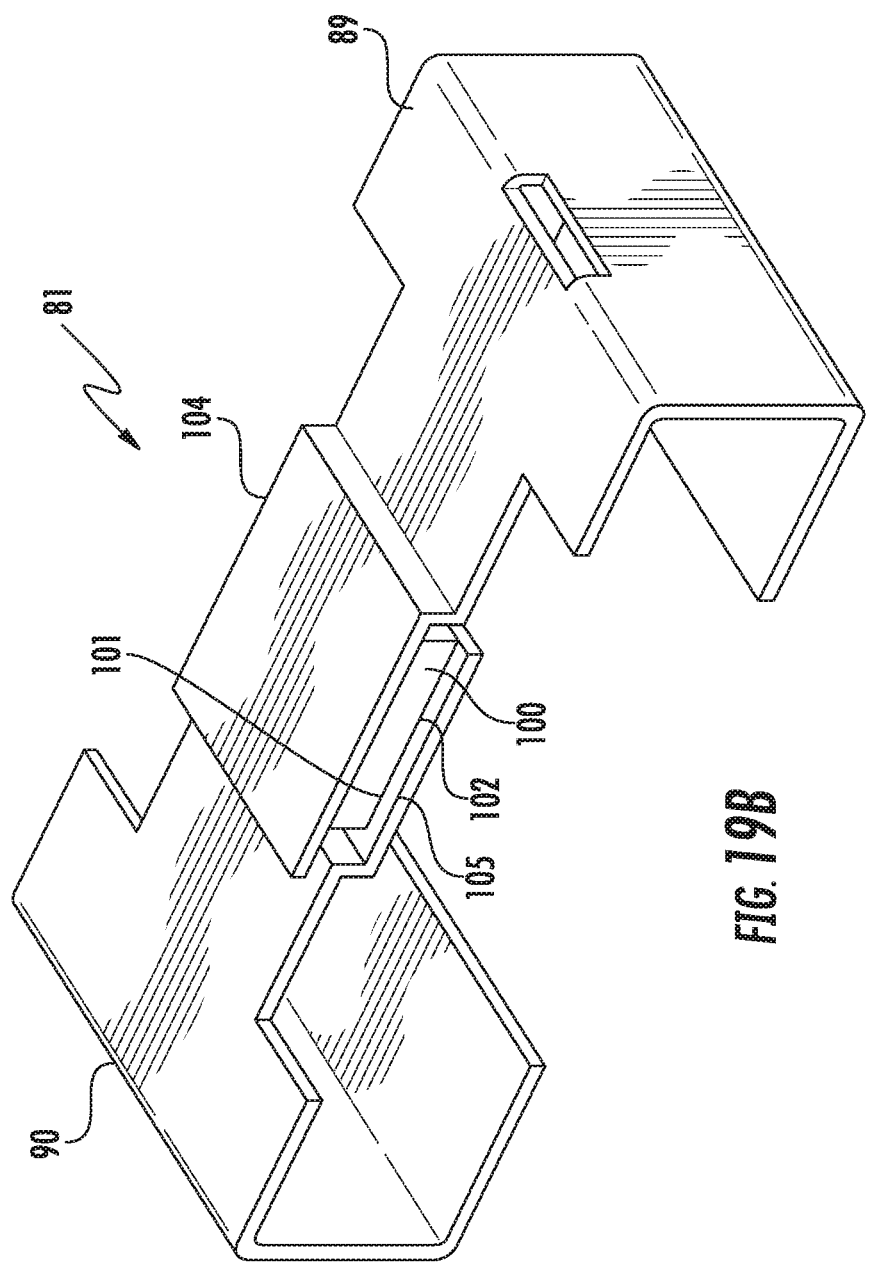

MOLDED BODY AND ELECTRICAL DEVICE HAVING A MOLDED BODY FOR HIGH VOLTAGE APPLICATIONS

CROSS REFERENCE TO RELATED APPLICATIONS

This application is a continuation of U.S. patent application Ser. No. 15/229,556, filed Aug. 5, 2016, issuing as U.S. Pat. No. 9,865,532 on Jan. 9, 2018, which claims the benefit of U.S. provisional patent application 62/202,580, filed on Aug. 7, 2015, the entire contents of all of which are incorporated by reference as if fully set forth herein.

TECHNICAL FIELD

The present invention is directed to electrical devices comprising electrical components packaged in molded bodies for high voltage applications, and in particular, to electrical components having ribbed molded bodies.

BACKGROUND

Various electrical components are available as devices having molded bodies, such as electrical components formed into molded packages.

For example, passive components may be formed into molded devices. Molded passive devices have been previously molded with a flat rectangular style package or body, having flat sides. Example of such devices are, for example, those offered by Vishay Dale as VISHAY® wirewound and metal film resistors under the designations WSR, WSC, WSF, and PSF. Such devices have a generally rectangular case as shown in the examples in FIGS. 21A-21H. Molded passive devices as shown include generally flat outer surfaces.

Internally, molded passive devices house one or more passive elements, e.g., one or more resistors, capacitors and/or inductors. A passive element such as a resistive element may be welded or soldered to a lead frame. The resistive element and lead frame assembly is then molded in a rectangular shaped package or body. As stated, the outer surfaces are generally flat, for example, having various planar surfaces. The leads may be formed around the end surfaces of the package to form a surface mount device.

Various passive elements may be attached to the leads of the package depending on the application requirements. One use for such packages may be as, for example, molded chip dividers. Active electrical components, such as various types of diodes, semiconductors, rectifiers, transistors, and integrated circuits, may also be formed as molded devices. Such molded active devices are available having molded bodies with either generally flat, oblong or rounded surfaces.

What is needed is a molded body for an electrical component having a body shape that allows for increased performance in high voltage applications.

SUMMARY OF THE INVENTION

Generally, the present invention relates to an electrical device comprising a ribbed molded body for an electrical component, wherein the ribbed molded body includes at least one surface or portion having a plurality of ribs along at least a portion of that surface. The ribbed molded body design functions to increase the surface distance between leads on different sides of the ribbed portion or portions of the body.

In an aspect of the present invention, a ribbed molded body having ribs formed houses an electrical component, which may be a passive component or an active component. The electrical component may be attached to a lead frame. The lead frame may have leads that extend outside the ribbed molded body and are bent around the ribbed molded body in order to form, for example, a surface mount device. The electrical component may be pre-molded or coated before it is over-molded with the ribbed molded body.

One or more surface or portion of the ribbed molded body according to the present invention may include ribs. In an aspect of the present invention, the ribbed molded body of the invention only has ribs along a portion of the molded body. The ribbed molded body may further have non-ribbed or flat surfaces or portions.

A method of making an electrical device comprising a ribbed molded body housing an electrical component is also provided.

BRIEF DESCRIPTION OF THE DRAWINGS

The advantageous features are described in an exemplary manner only and are not intended to restrict the invention in any way or form. The invention will be described in the following with regard to further features and advantages by way of examples with reference to embodiments in the enclosed drawings. The Figures of the drawings show:

FIG. 14 shows a bottom plan view of the electrical component having a ribbed molded body of FIG. 12.

FIG. 15 shows a top plan view of the electrical component having a ribbed molded body of FIG. 12.

FIG. 16 shows a detailed first side top perspective view of a ribbed portion of the electrical component having a ribbed molded body of FIG. 12.

FIG. 19B shows a back side top perspective view of the semiconductor attached to a lead frame of FIG. 19A.

DETAILED DESCRIPTION OF THE INVENTION

Figure 1:
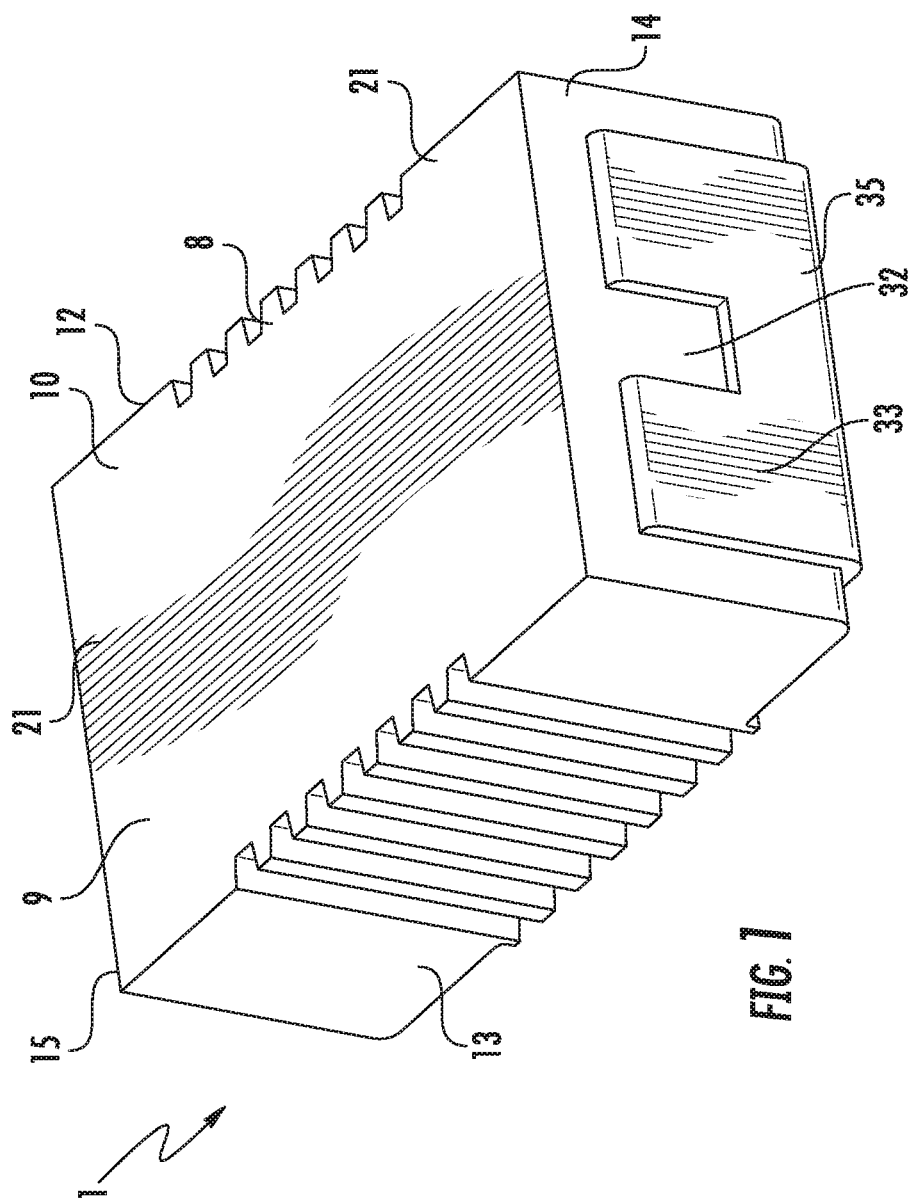
FIG. 1 shows a top front side perspective view of an embodiment of an electrical component having a ribbed molded body according to the present invention.

The present invention is directed to an electrical component having a ribbed molded body including one or more or a plurality of ribs along at least a portion or surface of the ribbed molded body, for use in high voltage applications. The ribbed molded body allows for increased performance in high voltage applications.

The description provided herein is to enable those skilled in the art to make and use the described embodiments set forth. Various modifications, equivalents, variations, combinations, and alternatives, however, will remain readily apparent to those skilled in the art. Any and all such modifications, variations, equivalents, combinations, and alternatives are intended to fall within the spirit and scope of the present invention defined by claims.

Certain terminology is used in the following description for convenience only and is not limiting. The words "right," "left," "top," and "bottom" designate directions in the drawings to which reference is made. The words "a" and "one," as used in the claims and in the corresponding portions of the specification, are defined as including one or more of the referenced item unless specifically stated otherwise. This terminology includes the words above specifically mentioned, derivatives thereof, and words of similar import. The phrase "at least one" followed by a list of two or more items, such as "A, B, or C," means any individual one of A, B or C as well as any combination thereof.

As shown in FIGS. 1-11, an electrical device 1 (also sometimes referred to as a "molded device" in the context of the invention) comprising an electrical component encased in a ribbed molded body for high voltage applications according to an embodiment of the invention includes at least one or more or a plurality of ribs 8 running along and/or formed in at least a portion of the ribbed molded body 9, such as the outer surface of the ribbed molded body 9 of the device. A ribbed molded body 9 (also sometimes referred to as a "molded body" in the context of the invention) is provided, the molded body 9 functioning as the package for the electrical component or components housed and/or encased by or within the molded body 9. In the embodiment shown in FIGS. 1-11, the electrical component illustrated is a passive component, namely, a resistor such as a metal film resistor.

As shown in the orientation depicted in FIGS. 1-11, the ribbed molded body 9 includes a top surface 10, opposite bottom surface 11, front surface 12, back surface 13, left side surface 14, and right side surface 15. A first lead 16 extends from an opening in the left side surface 14, and a second lead 30 and third lead 31 extend from an opening in the right side surface 15. As shown in FIGS. 1, 3, 4 and 5, the first lead 16 may include a slot 32 between a first portion 33 and a second portion 34. The first lead 16 extends along a portion of the left side surface 14 and bends underneath the body to run along a portion of the bottom surface 11 and form a single surface mount portion 35. As shown in FIGS. 2, 3, 4 and 5, the second lead 30 and the third lead 31 extend along a portion of the right side surface 15 and are bent underneath the body to run along a portion of the bottom surface 11, and form a second lead surface mount portion and a third lead surface mount portion.

Figure 11:
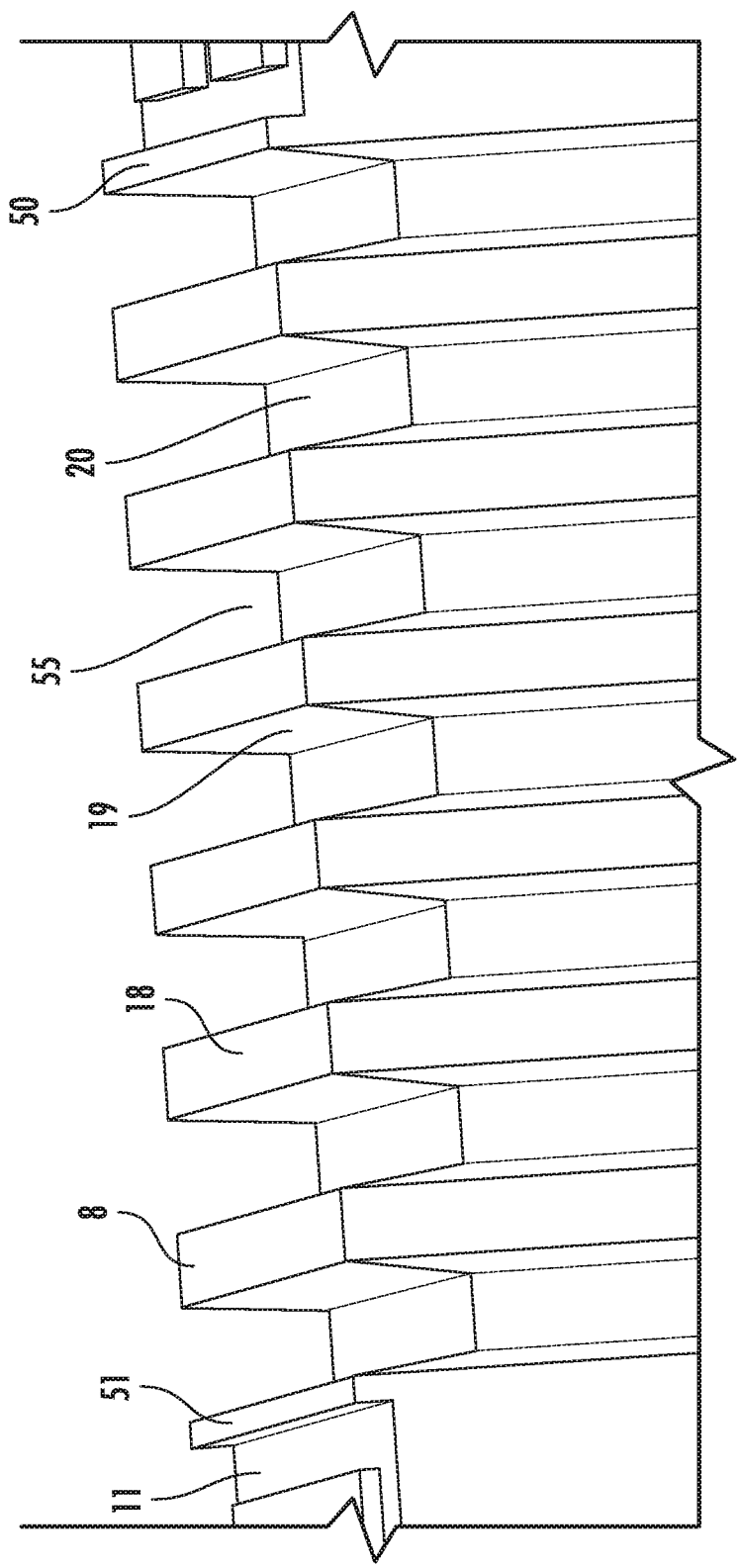
FIG. 11 shows a detailed view, in perspective, of a ribbed section of the electrical component having a ribbed molded body of FIG. 1.

As shown in FIGS. 1-11, and shown in greater detail in FIG. 11, the ribbed molded body 9 includes one or more or a plurality of ribs 8 along a ribbed portion of the molded body. The ribs 8 are preferably formed, molded and/or positioned along the front surface 12, bottom surface 11, and back surface 13. In the embodiment shown in FIGS. 1-11, the ribs are formed by depressions and/or indentations forming channels 55 in the ribbed molded body. These are shown in greater detail in FIG. 11. The ribs 8 may extend along one or more surfaces of the ribbed molded body 9.

Figure 5:
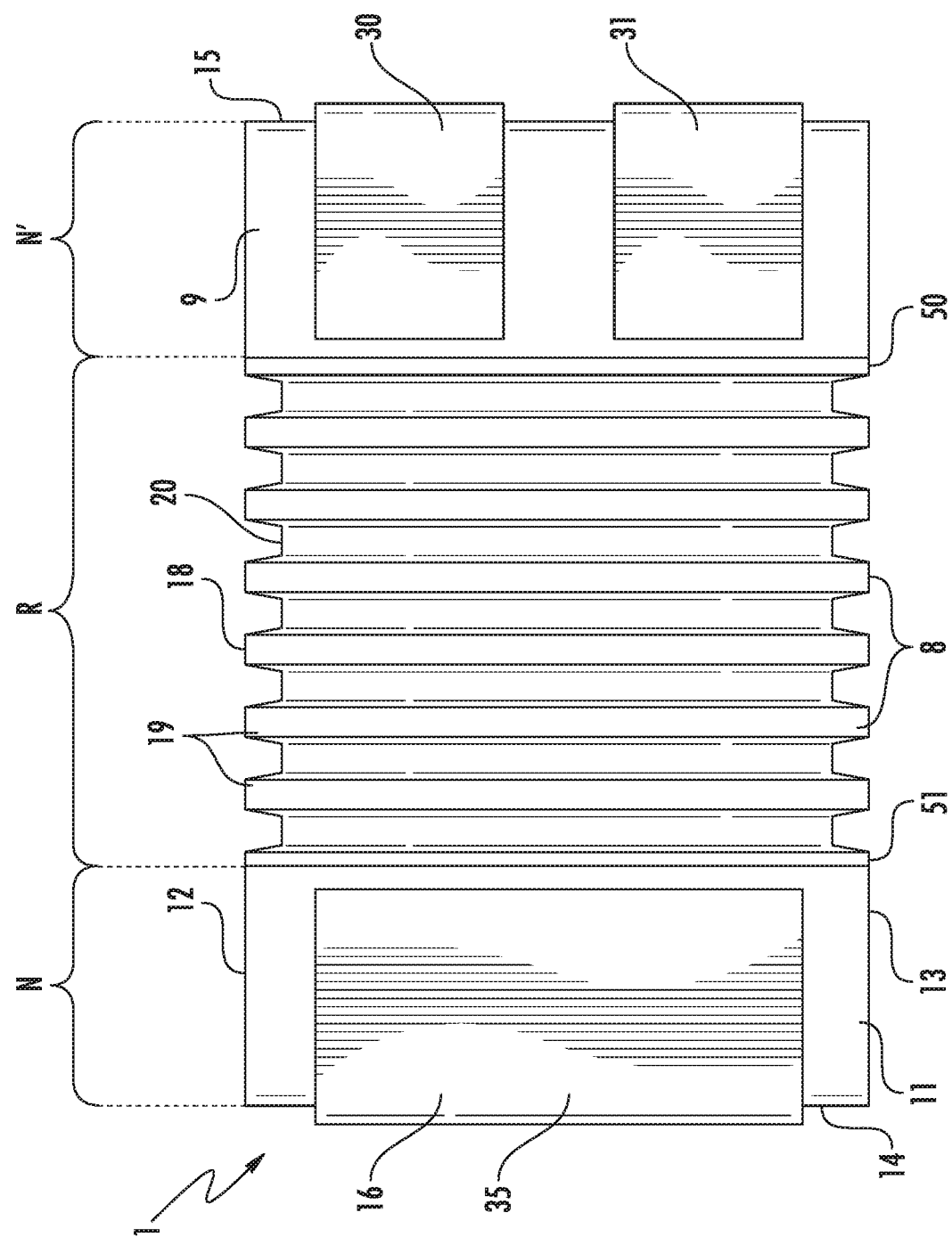
FIG. 5 shows a bottom plan view of the electrical component having a ribbed molded body of FIG. 1.

The ribs 8 may include a top wall 18 and sidewalls 19, and a bottom wall 20 may be provided between adjacent ribs 8. The bottom walls may be generally aligned along a plane running along each ribbed surface. It is contemplated that the ribs may have any desired shape, such as a planar, oblong or rounded protrusion. The sidewalls 19 may be straight or sloped at an angle, although other configurations may be used. The ribs 8 preferably run continuously and uninterrupted along ribbed portions of the front surface 12, bottom surface 11, and back surface 13. For example, FIG. 5 shows a ribbed portion of the device designated as R. Each rib 8 may be a contiguous piece extending along one or more surfaces of the molded body. Alternately, slots or breaks may be formed in the ribs at one or more locations. In addition, some ribs, for example, end ribs 50 and 51, may only extend along one surface of the molded body, such as the bottom surface 11. Adjacent ribs 8 form channels 55 having a selected depth between the ribs. The ribbed portion along the bottom of the molded body is shown in greater detail in FIG. 11.

The ribbed molded body 9 may further include portions that do not include ribs, e.g., non-ribbed, such as the portions designated as N and N' shown in FIG. 5. For example, opposite end lead portions 21, may be flat to accommodate the leads 16, 30, 31, with the leads forming surface mount terminals along the bottom of the body. In an embodiment, the lead portions 21 preferably do not include ribs, and are formed having flat surfaces, as shown in FIGS. 1-11.

Figure 2:
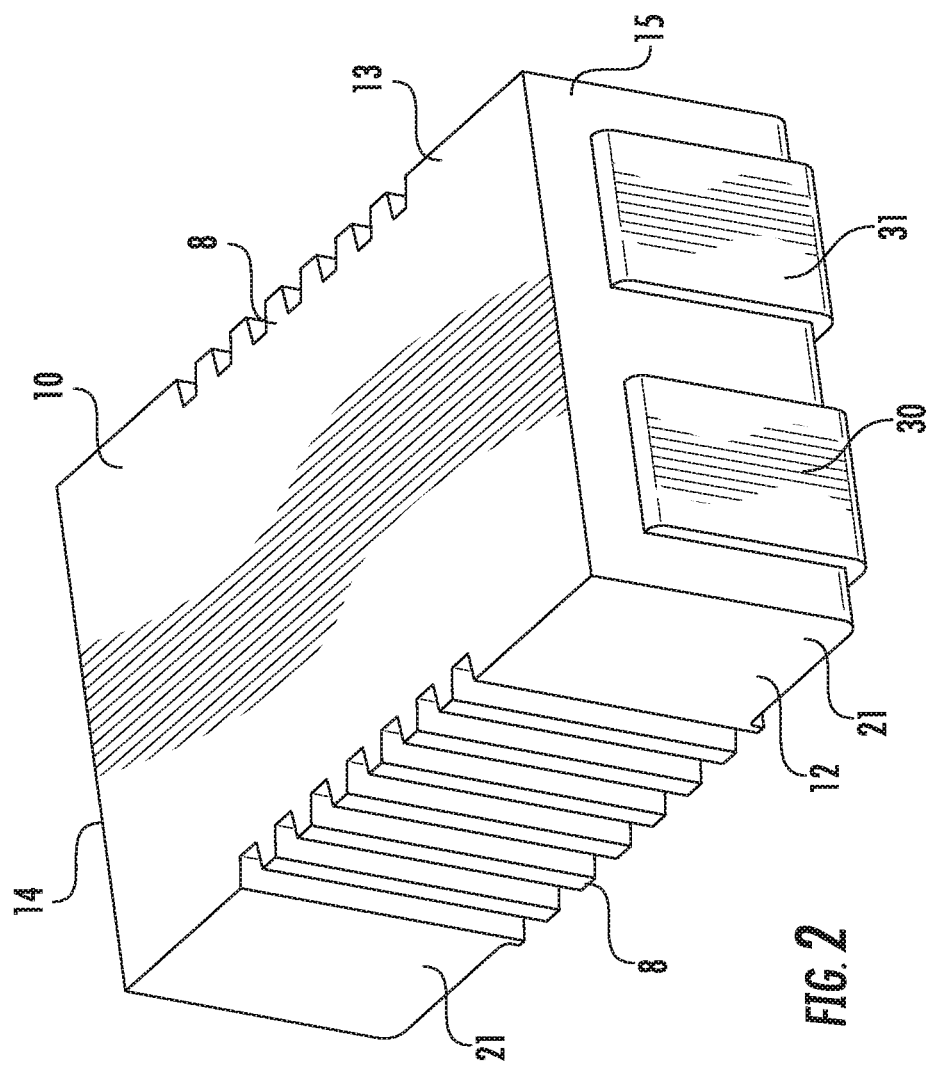
FIG. 2 shows a top back side perspective view of the electrical component having a ribbed molded body of FIG. 1.
Figure 3:
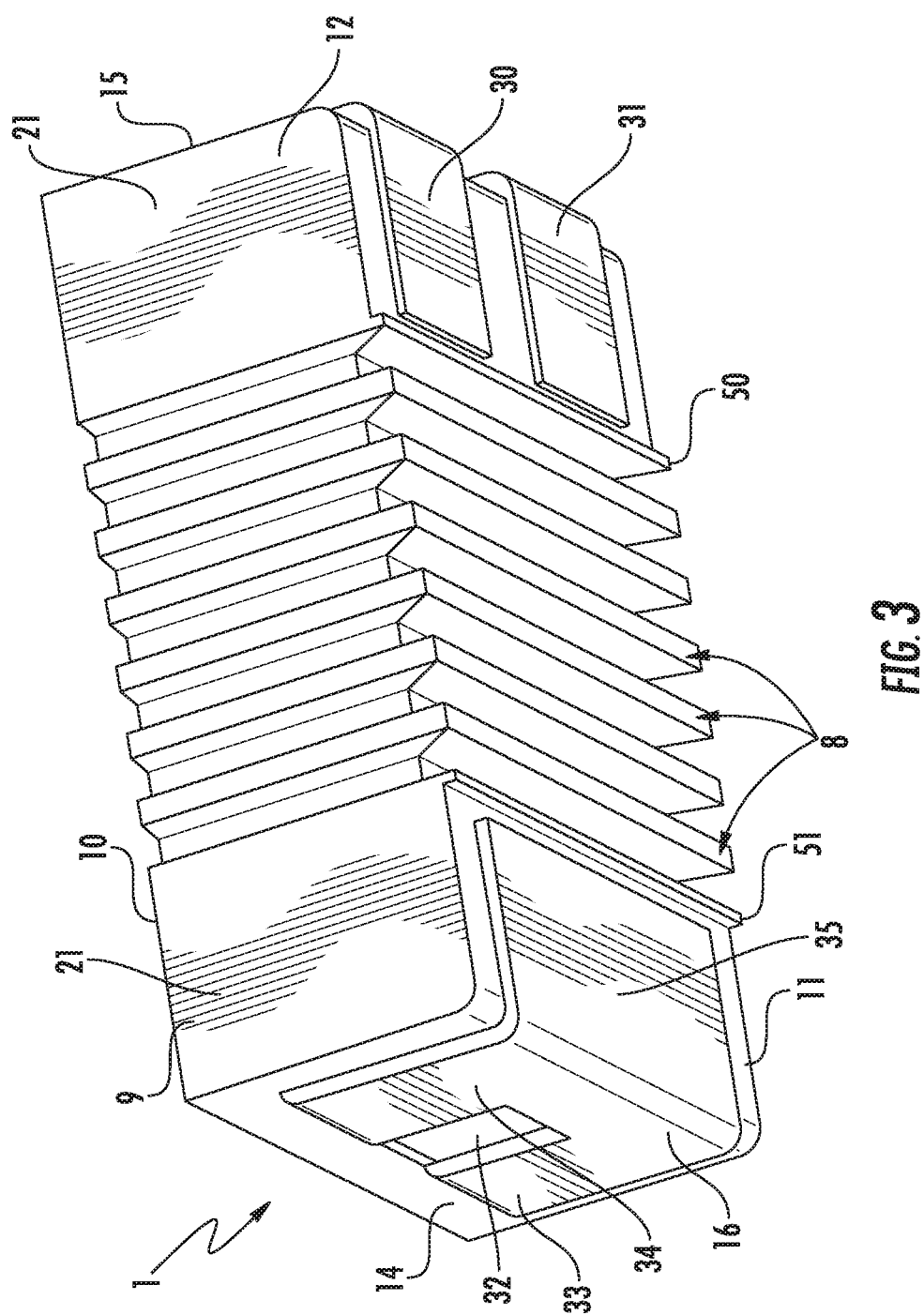
FIG. 3 shows a bottom first side perspective view of the electrical component having a ribbed molded body of FIG. 1.
Figure 4:
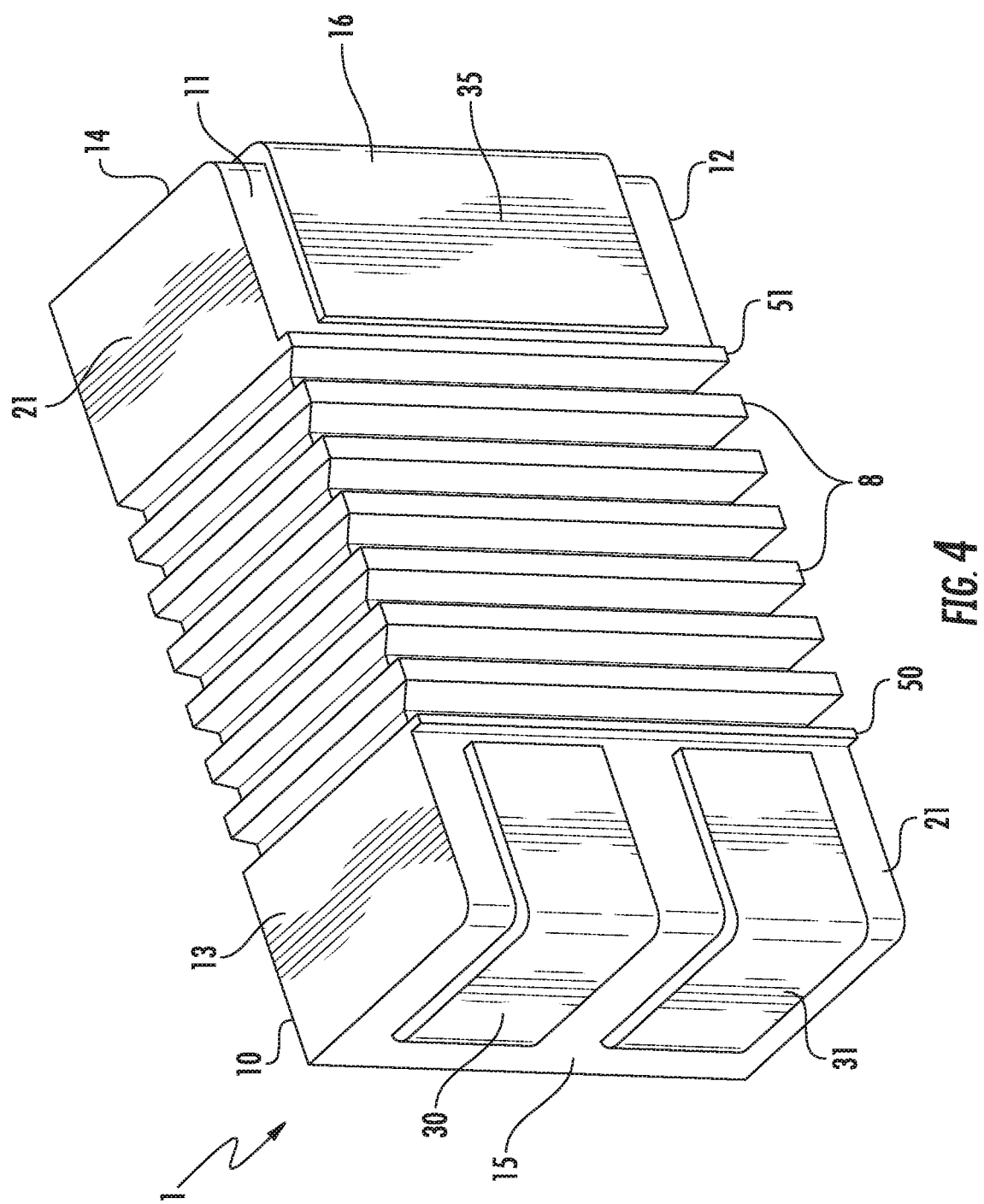
FIG. 4 shows a bottom second side perspective view of the electrical component having a ribbed molded body of FIG. 1.
Figure 6:
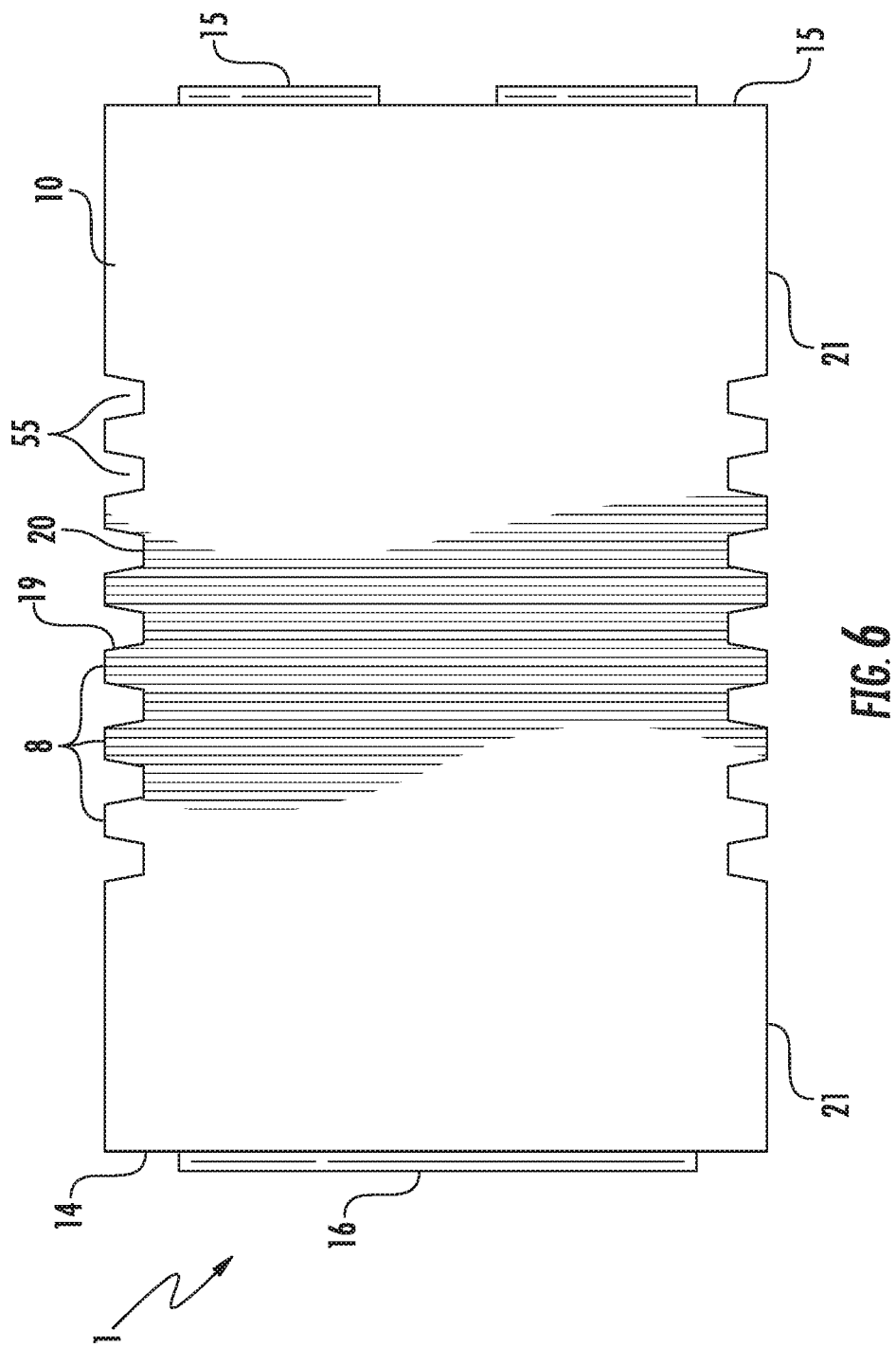
FIG. 6 shows a top plan view of the electrical component having a ribbed molded body of FIG. 1.

The leads 16, 30, 31 may extend along the left side surface 14 and right side surface 15, and along portions of the bottom surface 11 adjacent the flat lead portions 21 at the ends of the molded body. In a preferred embodiment, the top surface 10 does not include channels 55, and remains a flat surface, as shown in FIGS. 1, 2 and 6. The top surface 10 has the tops (top ends) of ribs 8 formed in the side surfaces, but the tops are flat and lie in the same plane as the rest of the top surface 10 of the ribbed molded body 9. This allows for marking of the molded body and automated board placement of the device 1. The leads 16, 30, 31 are attached to and/or form part of a lead frame 41, which will provide support for a passive component. End ribs 50, 51 may be provided dividing the ribbed portion of the molded body from the lead portions.

Figure 7:
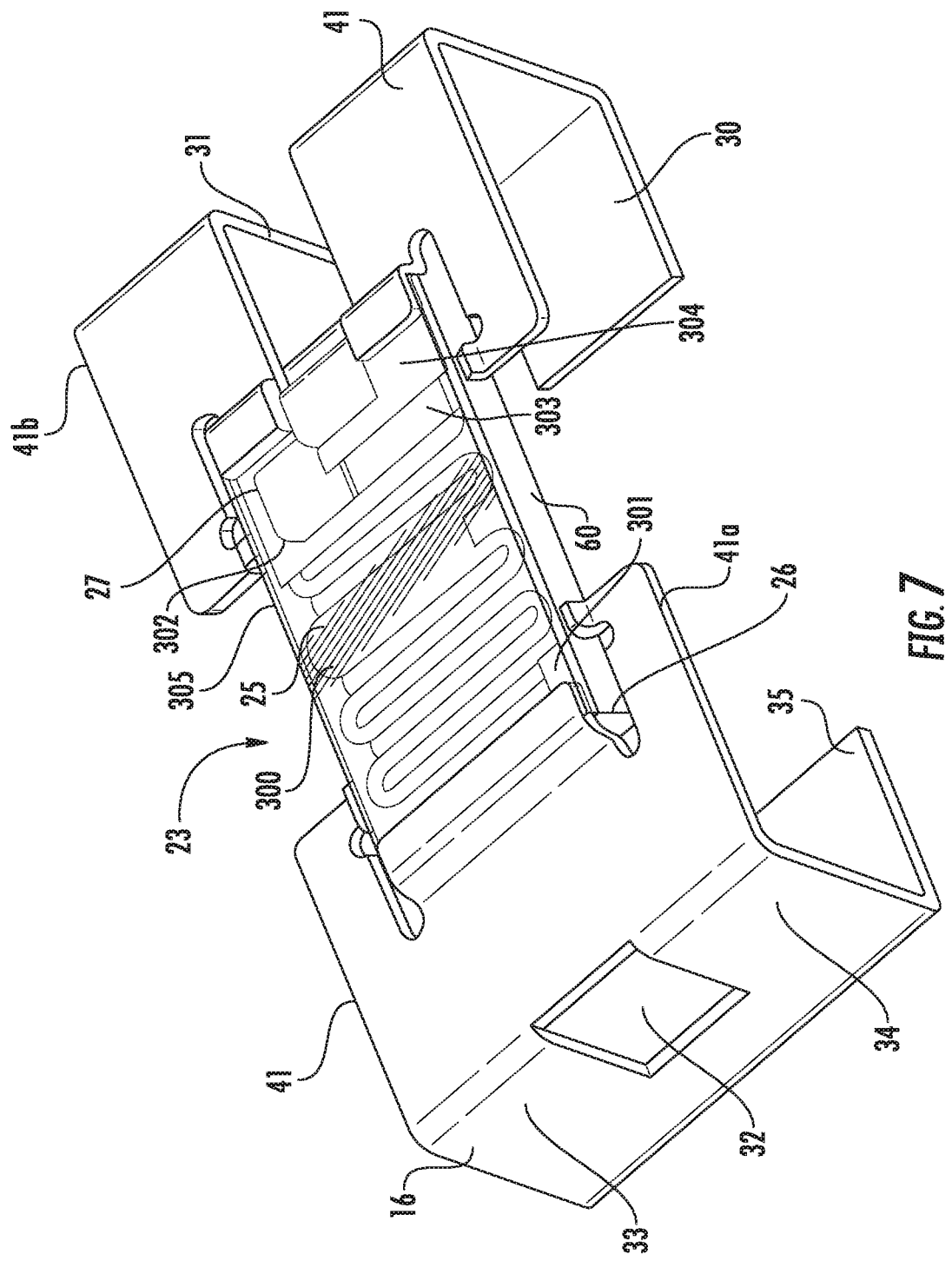
FIG. 7 shows a top first side perspective view of a lead frame, leads, and an electrical component as molded into the interior of a ribbed molded body as shown in FIG. 1.
Figure 8:
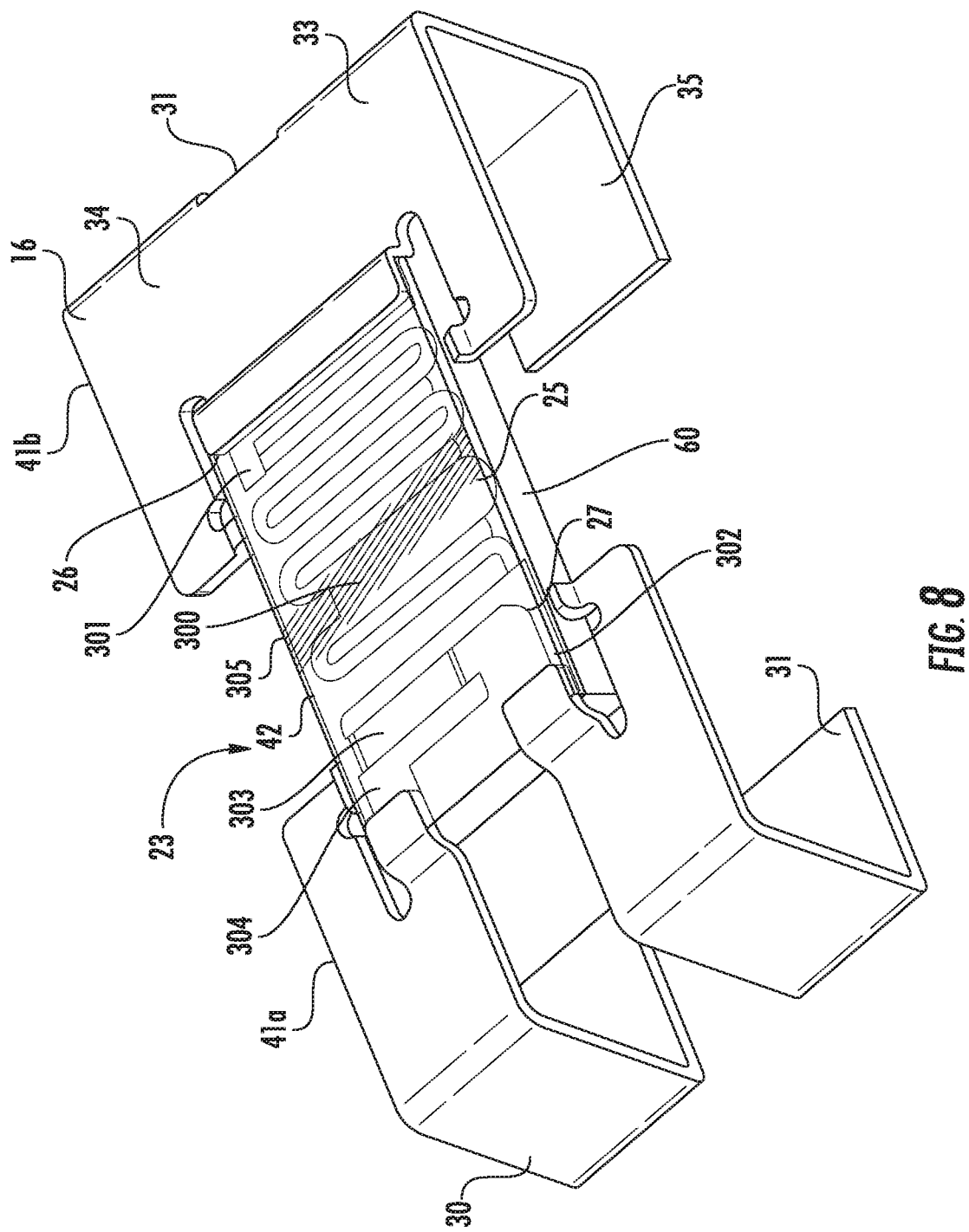
FIG. 8 shows a top second side perspective view of the lead frame, leads and electrical component of FIG. 7.
Figure 9:
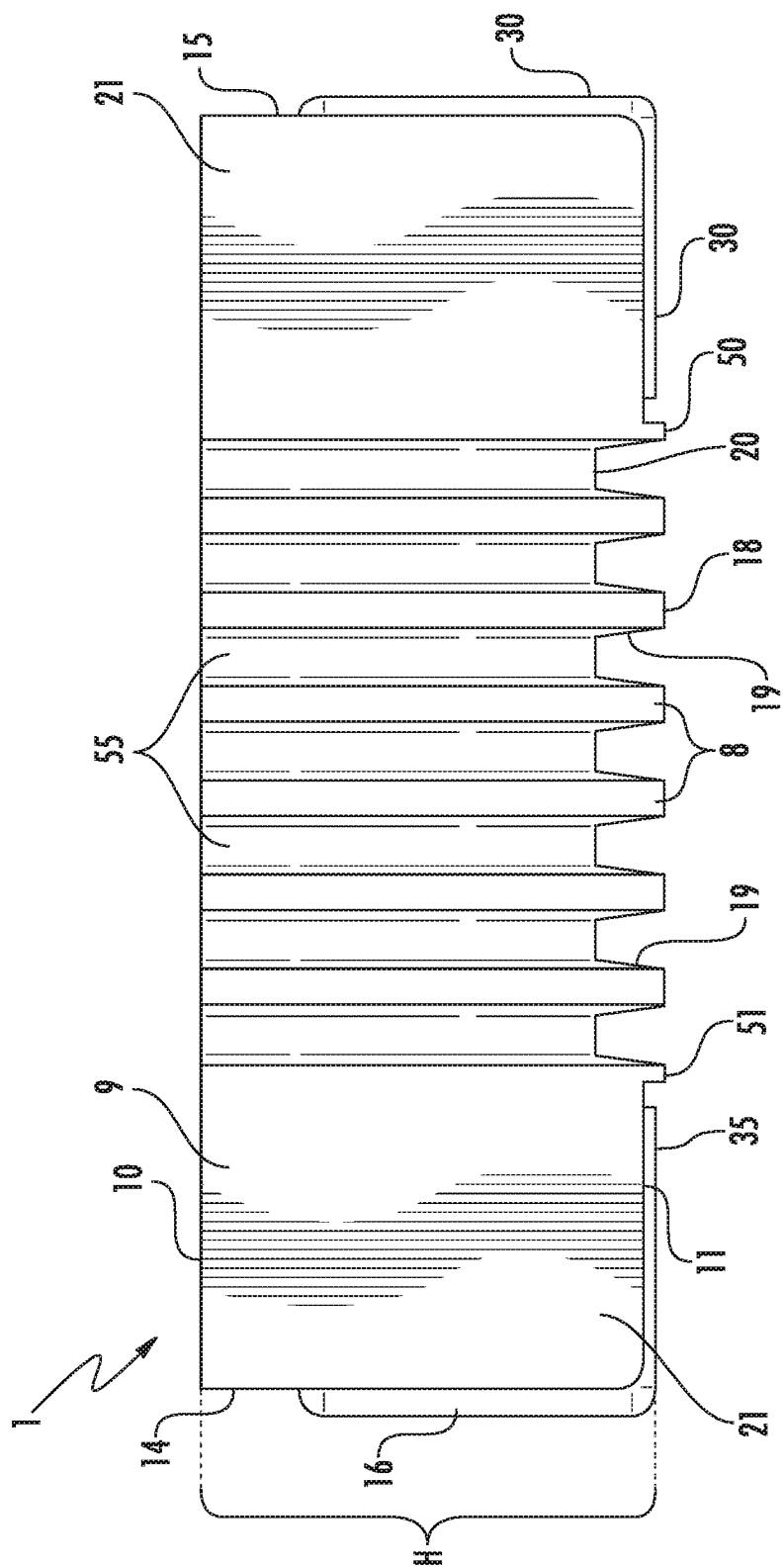
FIG. 9 shows a first side plan view of the electrical component having a ribbed molded body of FIG. 1.
Figure 10:
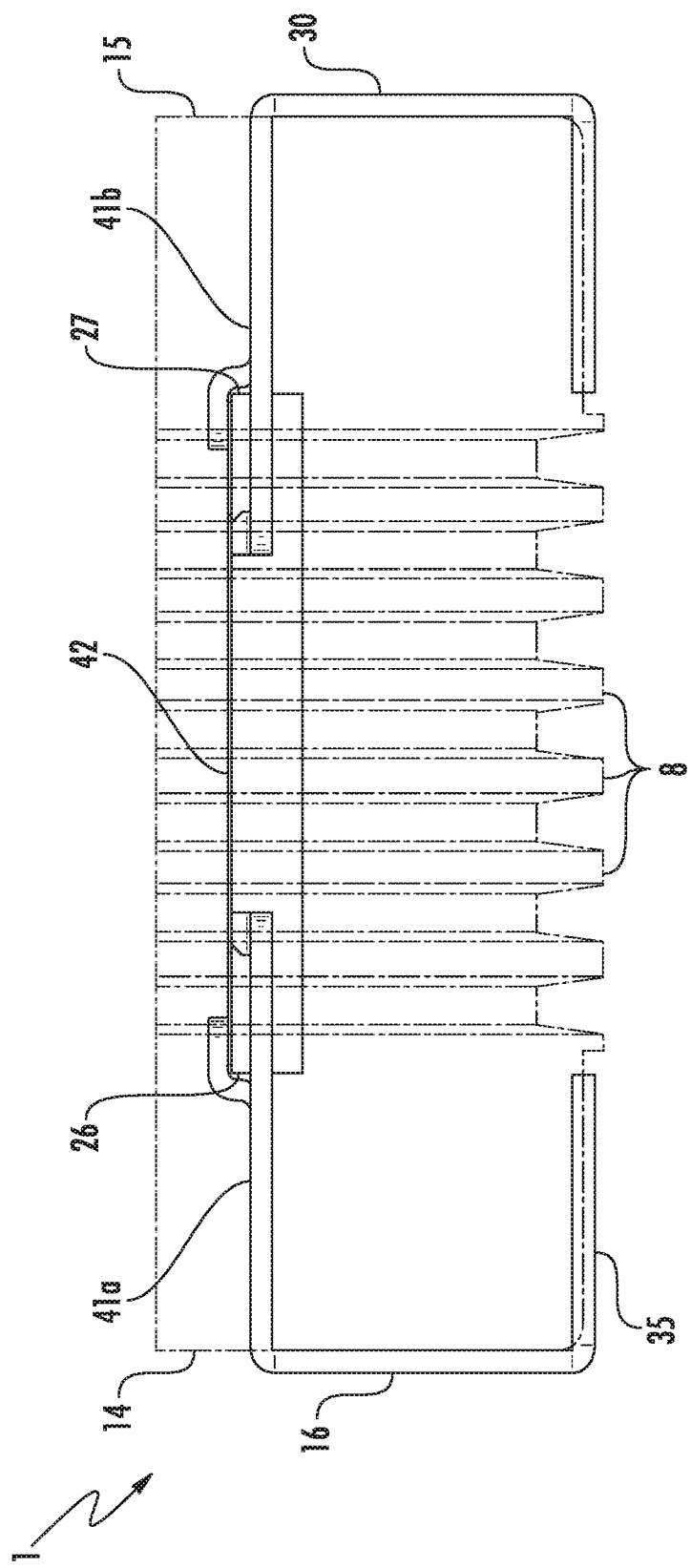
FIG. 10 shows a first side plan view in partial transparency of the electrical component having a ribbed molded body of FIG. 1.

In an embodiment, as shown in FIGS. 7 and 8, a passive component 23 is provided molded into the interior area of the ribbed molded body 9, and coupled to the lead frame 41. For example, the passive component 23 may be a resistor 42, comprising a resistive element 25 coupled to the lead frame 41, and having a first end 26 in contact with or otherwise connected (e.g., by an electrical connection) to a first portion of the lead frame 41a including the first lead 16, and a second end 27 in contact with or otherwise connected to (e.g., by an electrical connection) a second portion of the lead frame 41b including the second lead 30 and third lead 31. The resistive element 25 may comprise, by way of example, a tantalum nitride resistive film formed on a substrate 60, such as a ceramic substrate. The resistor 42 may be attached to the lead frame such as by welding, a friction fit, clamped, or another type of attachment. While a resistor 42 is shown, it is appreciated that other passive components could also be packaged having ribbed molded bodies according to the principles of the present invention.

In particular, the resistor 42 shown in FIGS. 7 and 8 comprises a high voltage resistor 300 in electrical communication adjacent a first end 26 with a high voltage conductor 301, and at a second end 27 with a voltage sense conductor 302, low voltage resistor 303, and ground conductor 304. A dielectric overcoat 305 may be applied over the resistor 42. The electrical component functions as a chip divider. The electrical component may be pre-molded or coated before it is over-molded with the ribbed molded body. In this arrangement, the first lead 16 may comprise a high voltage terminal, the second lead 30 may comprise a voltage sense terminal, and the third lead 31 may comprise a ground terminal.

Many attributes of the molded body may be varied. By way of example, the dimensions of the molded body (height, length, width), the height of the ribs, the width of each rib, the distance between ribs, the number of ribs, the depth and/or width of the channels, the length of the ribbed portion, the material that the molded body is made from, and/or other attributes of the molded body can be varied according to the requirements and/or uses of the molded passive component.

In addition, the ratio of the ribbed portion of the molded body to the non-ribbed portion can be varied based on preferences and applications. Thus, by way of example, the non-ribbed portion of the molded body may extend along a length N and N' of a surface of the molded body, while the ribbed portion R may extend along a length R, as shown in FIG. 5. The lengths of N, N' and R can be adjusted. For example, the combined lengths of N and N' may be greater than the length of R, may be less than the length of R, or may be equal to the length of R. N and N' may have different lengths or generally equal lengths. The length of R may be chosen to be a multiple or ratio of either the length of N or N', or the combined lengths of N and N'.

The material used for the molded body may be any mold compound, and preferably, by way of example, a mold compound with a comparative tracking index (CTI) of 600V.

The resistive element may be formed according to principles relating to, by way of example, any thick (e.g., VISHAY® resistor model CDHV) or thin (e.g. VISHAY® resistor model PTN) film, wirewound (e.g., VISHAY® resistor model RS), metal strip (e.g., VISHAY® resistor model WSL), or metal film (e.g., VISHAY® resistor model PTF). The resistive element may comprise, by way of illustration only and not by way of limitation, a tantalum nitride resistive film, or ruthenium oxide. A person of skill in the art will appreciate the many resistive elements and materials for forming such resistive elements that could be used in a molded passive component according to the present invention.

The leads and lead frame may be formed from any metal alloy that offers good electrical conductivity and formability, preferably a copper alloy with plating to enable solderability.

The ribbed molded body design functions to increase the surface distance from the first lead to the second lead and/or third lead, allowing for the application of higher voltage between said leads by increasing the "creepage distance," the shortest distance between two uninsulated conductors. This is described, for example, in International Electrotechnical Commission (IEC) 60664-1. A device according to the present invention may be formed to comply with creepage distances to avoid failure due to tracking such as described, for example, in IEC 60664-1 and its appendices.

When using a carbon based encapsulate material the presence of surface pollutants and high voltage can create conductive tracks that will degrade the performance and safety of the part and the application in which it is installed. The ribbed molded package in combination with a molding compound, which may comprise, for example polymers, thermoplastic materials, polyamide materials, or other similar materials or combinations of materials, that has a comparative tracking index (CTI) of 600V enables the device to meet the requirements of Pollution Degree 2 for basic insulation at 2500 Vrms or reinforced insulation at 1250 Vrms. For the referenced voltage rating, considering a chip divider for example, the surface distance from the ground terminal or voltage sense terminal to the high voltage terminal must be at least 12.5 mm to avoid failure due to tracking. The referenced mold compound with a CTI of 175 V and the non-ribbed package can only meet the requirements of Pollution Degree 2 for basic insulation at 550 Vrms or reinforced insulation at 225 Vrms. Thus, the novel ribbed design of the present invention provides increased performance as compared to a similar design without the ribbed surfaces.

Figure 12:
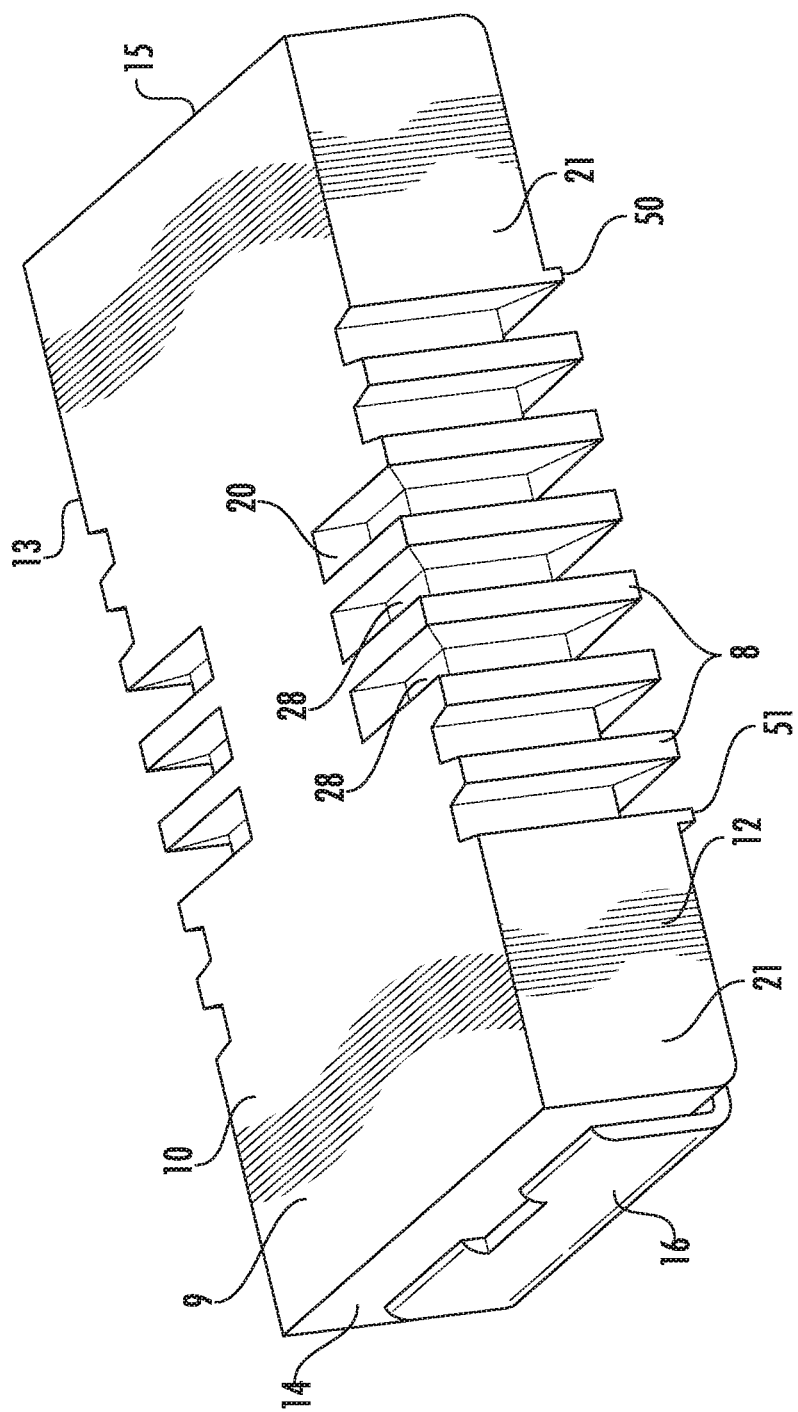
FIG. 12 shows a top first side perspective view of an electrical component having a ribbed molded body according to an embodiment of the present invention.
Figure 13:
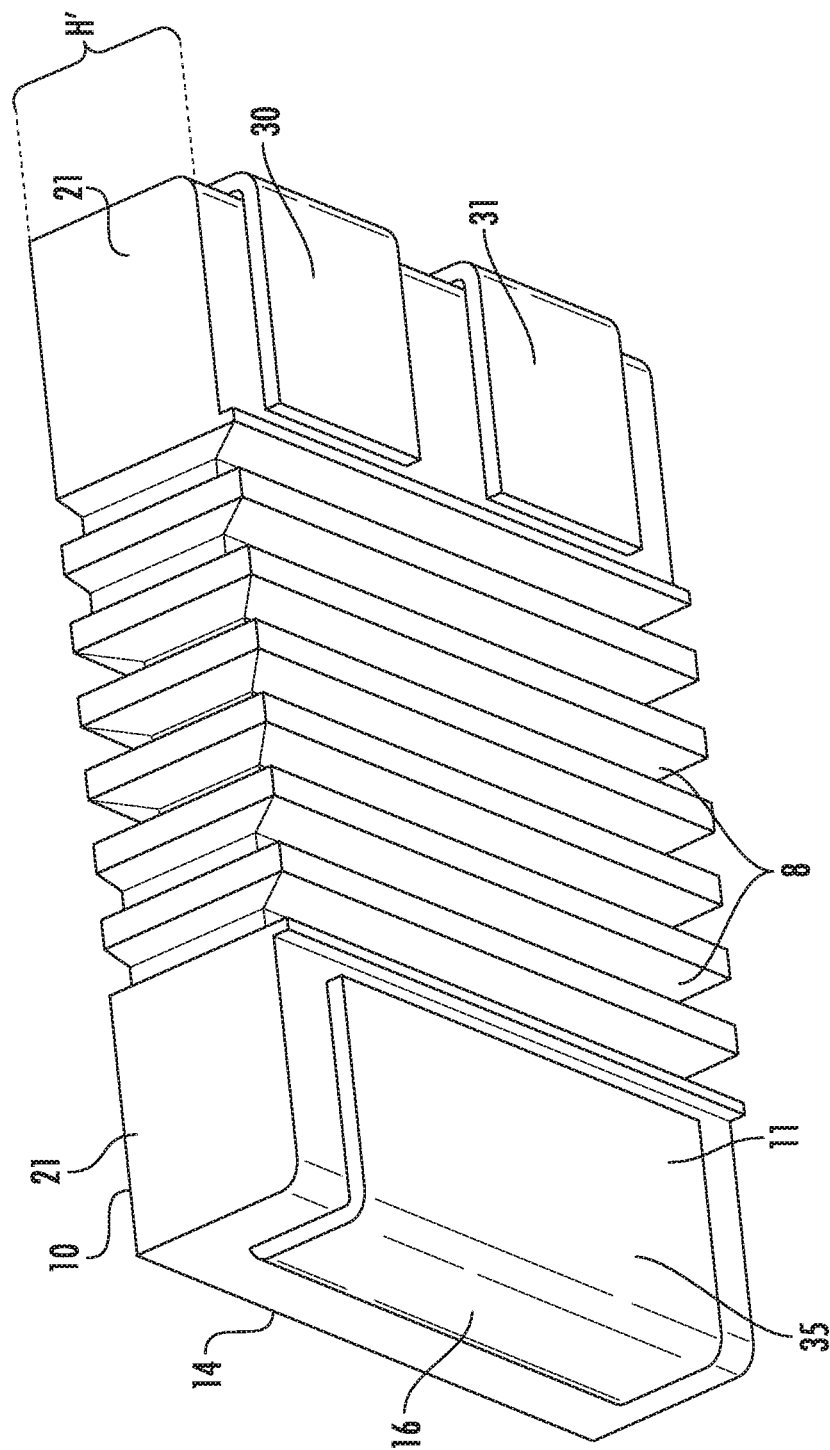
FIG. 13 shows a bottom first side perspective view of the electrical component having a ribbed molded body according to FIG. 12.

FIGS. 12-16 show another embodiment of an electrical component having a ribbed molded body according to the invention. This embodiment has similar features as the embodiment shown in FIGS. 1-11 (as shown by the similar numbering), but has a lower comparative profile than the embodiment shown in FIGS. 1-11 (e.g., lower height H' as shown in FIG. 13 as compared to the height H shown in FIG. 9). As shown in FIGS. 12, 15 and 16, some of the ribs 8 further include steps 28 adjacent bottom walls 20 of some of the ribs 8 and the top surface 10. This provides a smaller diameter flat surface portion 70 along a central part of the top surface 10 of the ribbed molded body 9, having a depth D extending to the base of the steps 28, with the base of the steps 28 corresponding to the top end of one of the "stepped" ribs. As shown in FIG. 15, the depth D is less than the full width W of the top surface 10. As shown in FIGS. 12-16, this arrangement provides for ribs of varying sizes and depths along varying surfaces. The embodiment shown in FIGS. 12-16 may house a passive electrical component, as previously described with respect to FIGS. 1-11. In addition, the molded body style shown in FIGS. 12-16 may be used to house an active electrical component, such as described in further detail below.

While an illustrative arrangement of leads is shown in FIGS. 1-16, the ribbed molded body of the present invention can be employed with any type of lead arrangement. For example, VISHAY® brand resistor models WSR, WSC, WSN, WSL, WSF, PSF show lead arrangements that could be incorporated into a molded passive device according to the present invention. By way of another example, two-, three- and four-lead arrangements could be incorporated into a molded passive device according to the present invention.

Figure 17A:
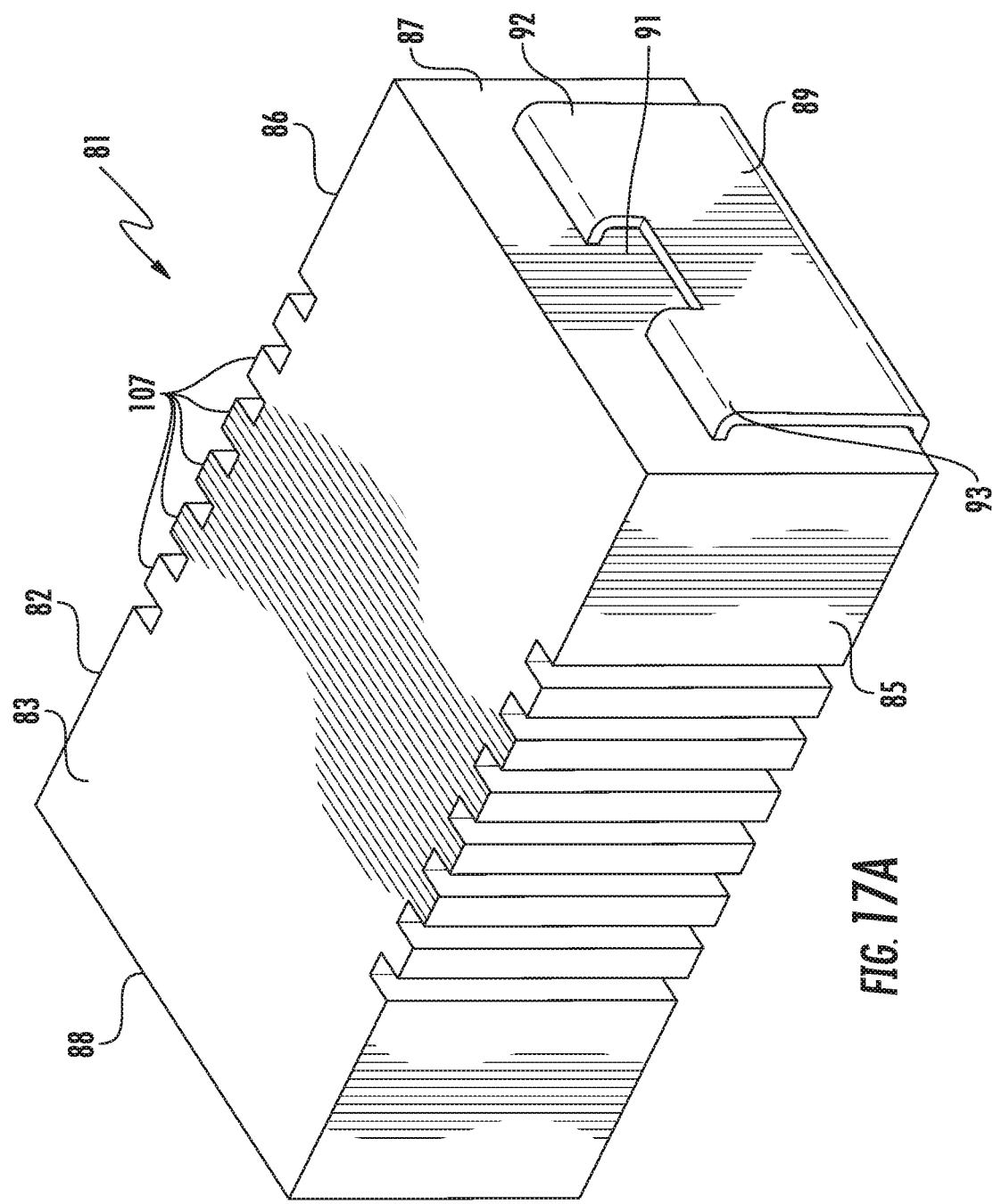
FIG. 17A shows a top back side perspective view of an embodiment of an electrical component having a ribbed molded body according to the invention.
Figure 17B:
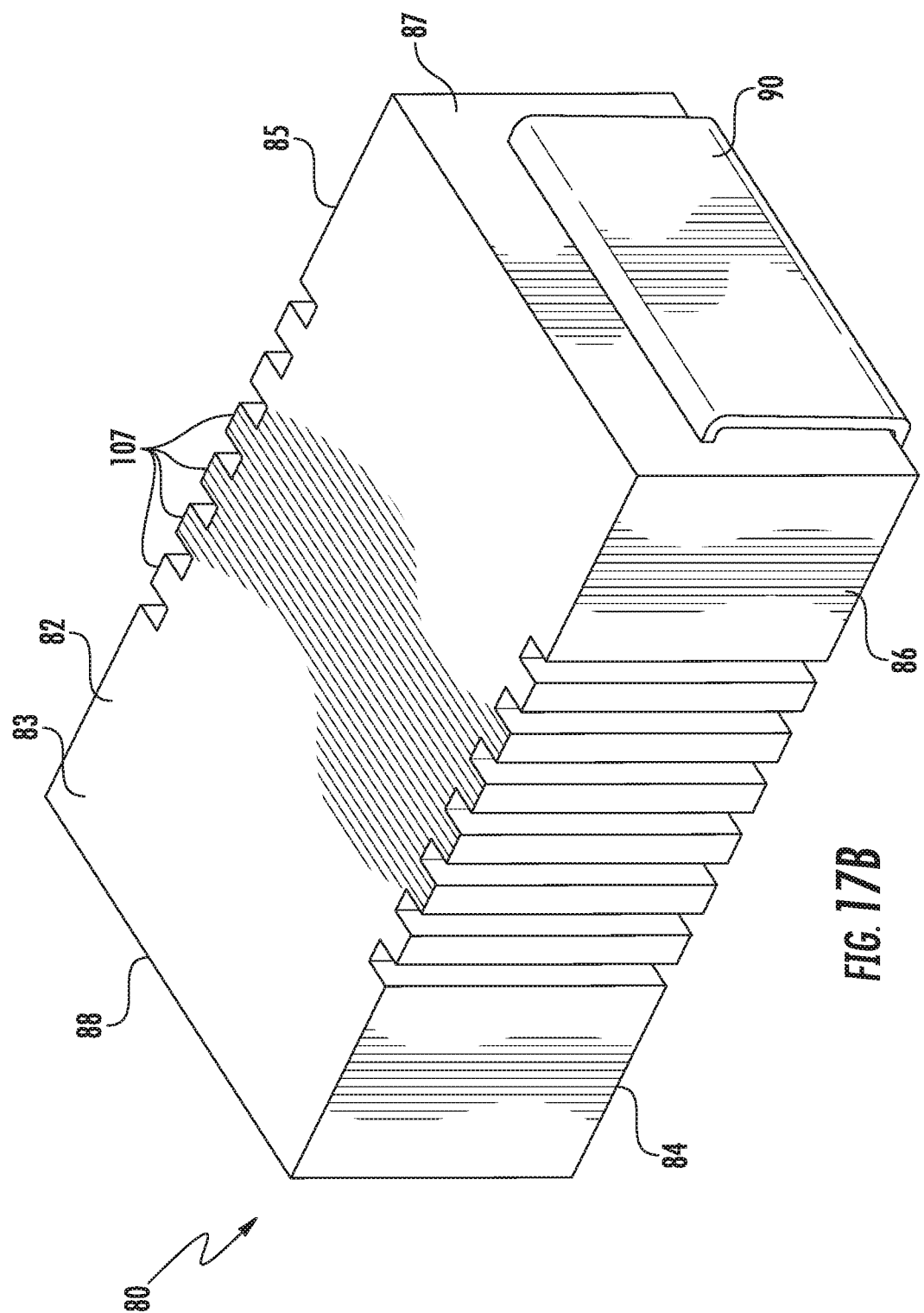
FIG. 17B shows a top front side perspective view of the electrical component having a ribbed molded body of FIG. 17A.
Figure 18:
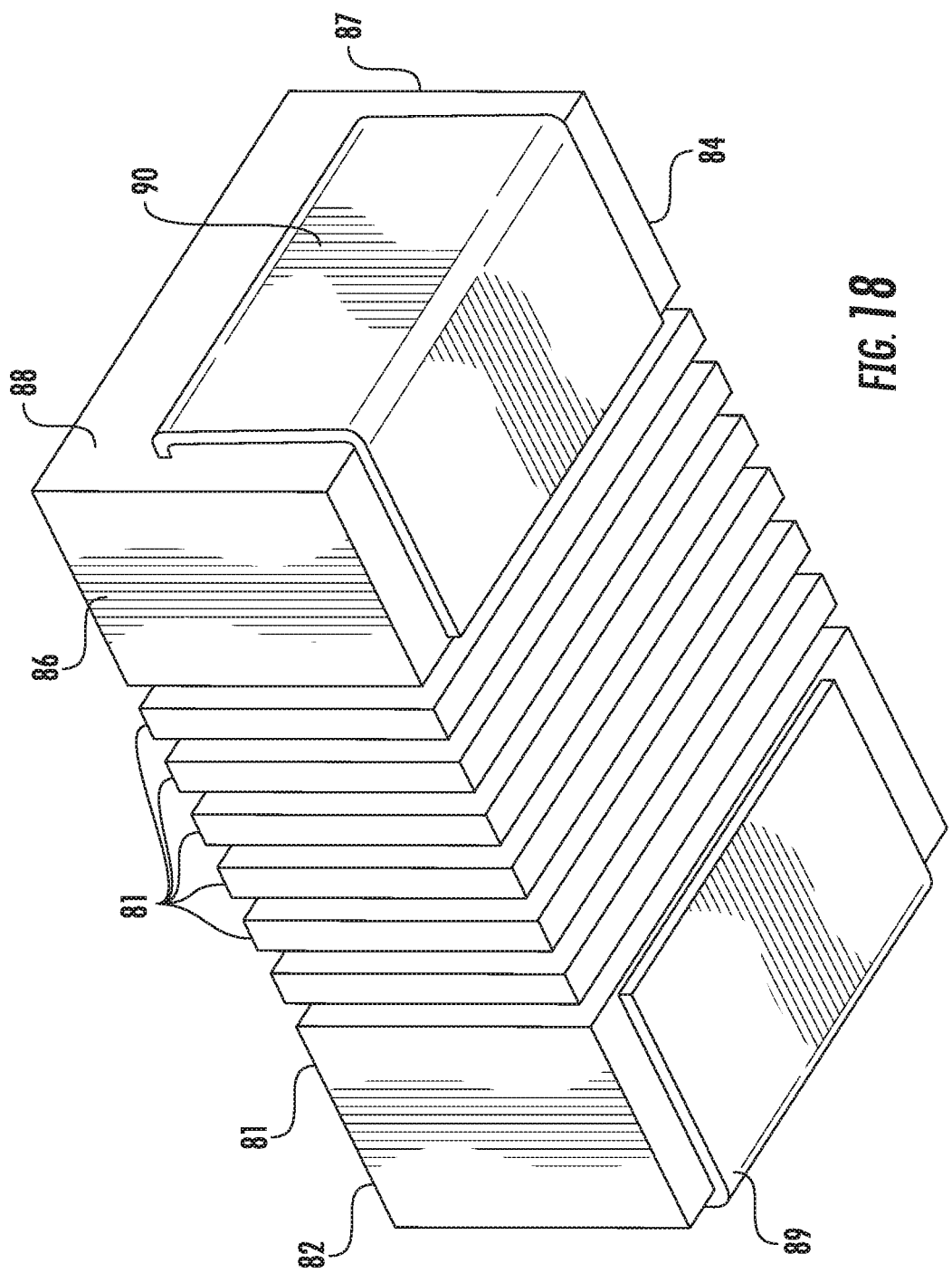
FIG. 18 shows a bottom front side perspective view of the electrical component having a ribbed molded body of FIG. 17A.
Figure 19A:
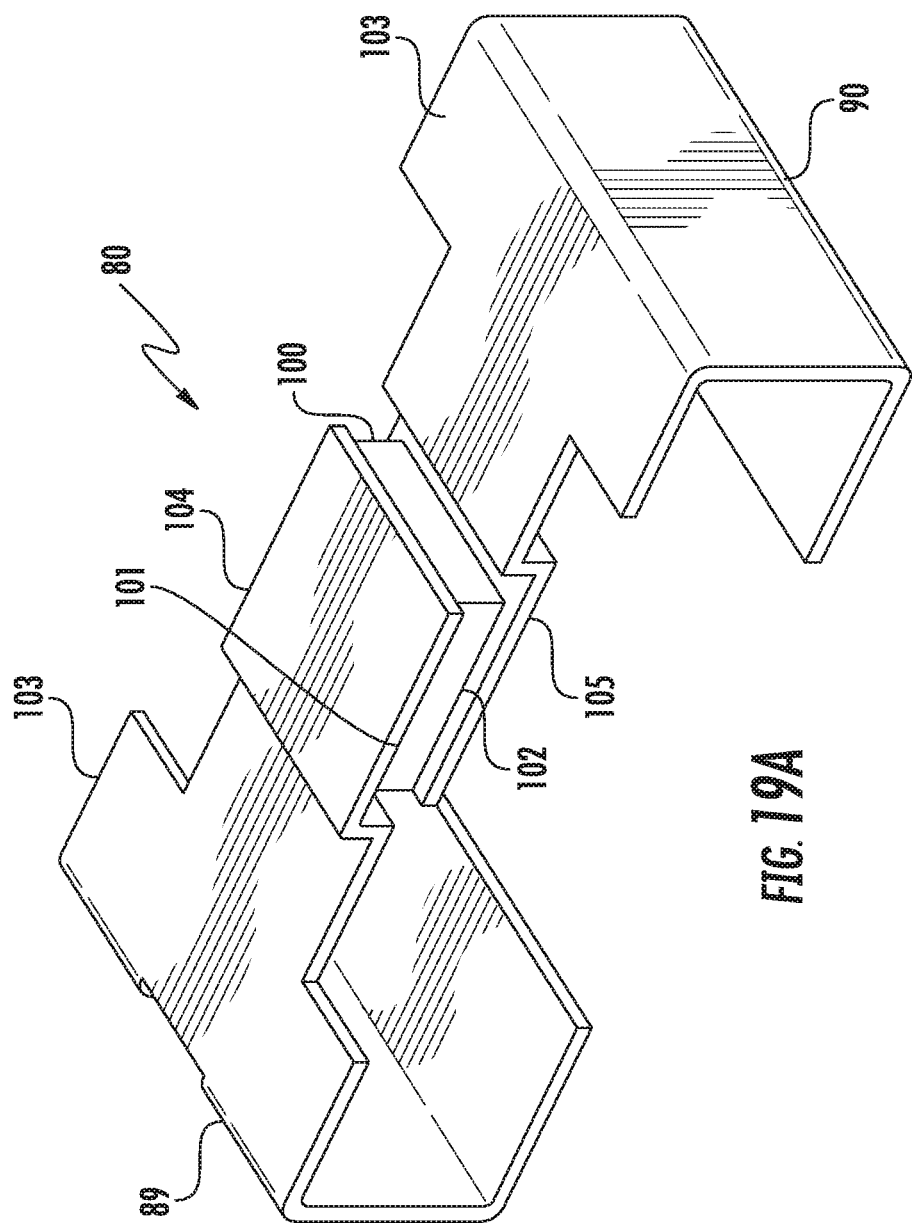
FIG. 19A shows a front side top perspective view of an embodiment of a semiconductor attached to a lead frame for use with a ribbed molded body according to the present invention.

A ribbed molded body of the present invention may also house active electrical components, such as, for example, diodes, semiconductors, rectifiers, transistors, or integrated circuits. FIGS. 17A-20B show examples of active electrical components having molded bodies according to the invention. FIGS. 17A and 17B show an assembled molded device 80 housing an active component 81. The ribbed molded body 82 includes a top surface 83, opposite bottom surface 84, back surface 85, front surface 86, left side surface 87, and right side surface 88. A first lead 89 extends from an opening in the left side surface 87, and a second lead 90 extends from an opening in the right side surface 88. As shown in FIG. 17A, the first lead 89 includes a slot 91 between a first portion 92 and a second portion 93. The first lead 89 extends along a portion of the left side surface and bends underneath the body to run along a portion of the bottom surface 84 and form a single surface mount portion 94. As shown in FIG. 17B, the second lead 90 extends along a portion of the right side surface and bends underneath the body to run along a portion of the bottom surface 84. At least a portion of the molded body 82 includes ribs 107, such as those previously described and shown.

The molded body of FIGS. 17A and 17B may house and/or encase, for example a semiconductor die. A semiconductor die 100 shown for illustrative purposes can be seen in FIGS. 19A and 19B, connected to a lead frame 103. The semiconductor die 100 includes a first conducting surface 101, and a second conducting surface 102. The first conducting surface 101 of the semiconductor die 100 may be die-bonded or wire-bonded to a first connection portion 104 of the lead frame 103. The second conducting surface 102 of the semiconductor die 100 may be die-bonded or wire-bonded to a second connection portion 105 of the lead frame 103. The ribbed molded body 82 is then molded around the semiconductor die 100 and lead frame 103, leaving the first lead 89 and second lead 90 exposed, so that the leads can be bent along the sides and bottom surface of the ribbed molded body 82 to form surface mount terminals.

Figure 20A:
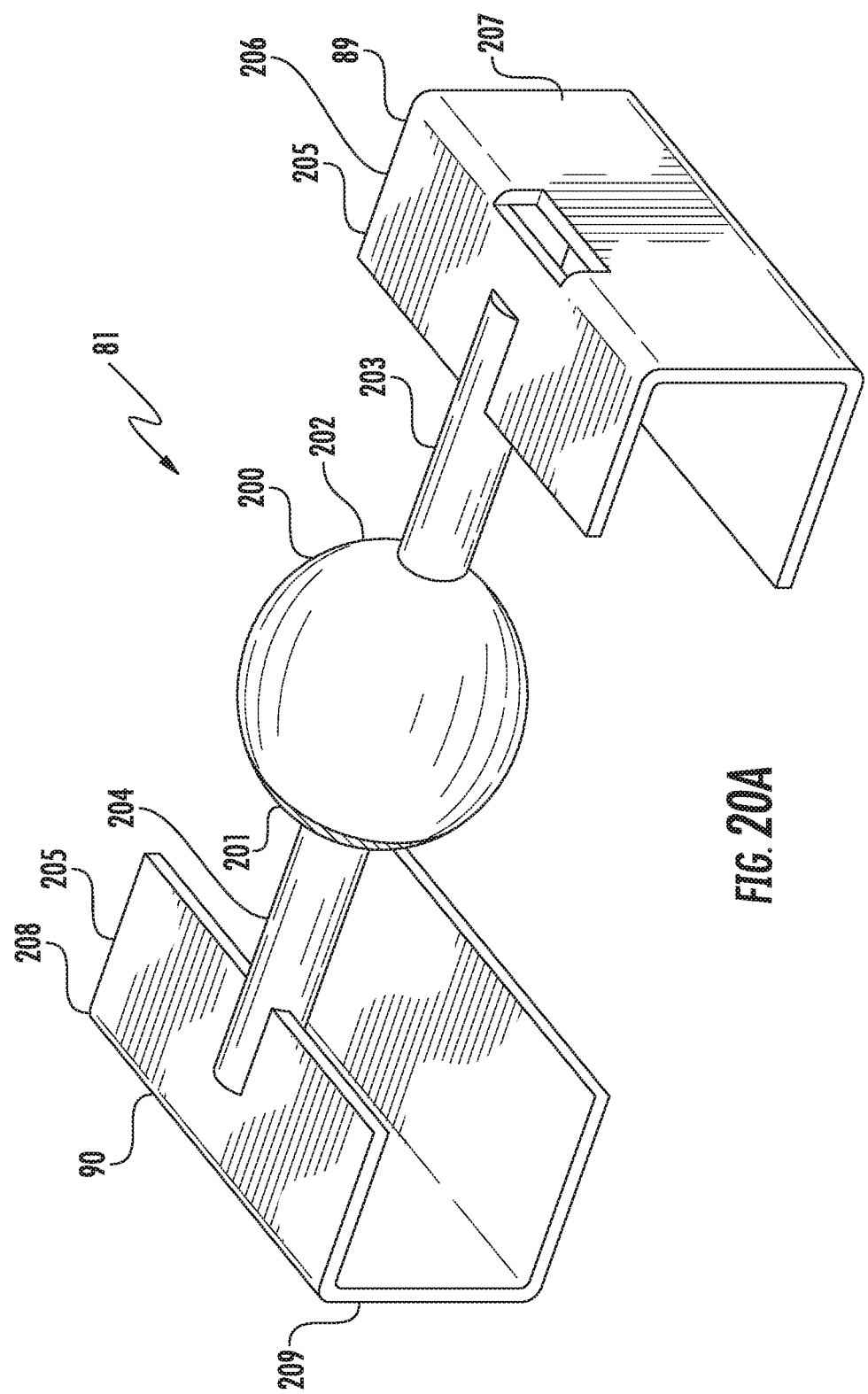
FIG. 20A shows a back side top perspective view of a diode attached to a lead frame for use with a ribbed molded body according to the present invention.
Figure 20B:
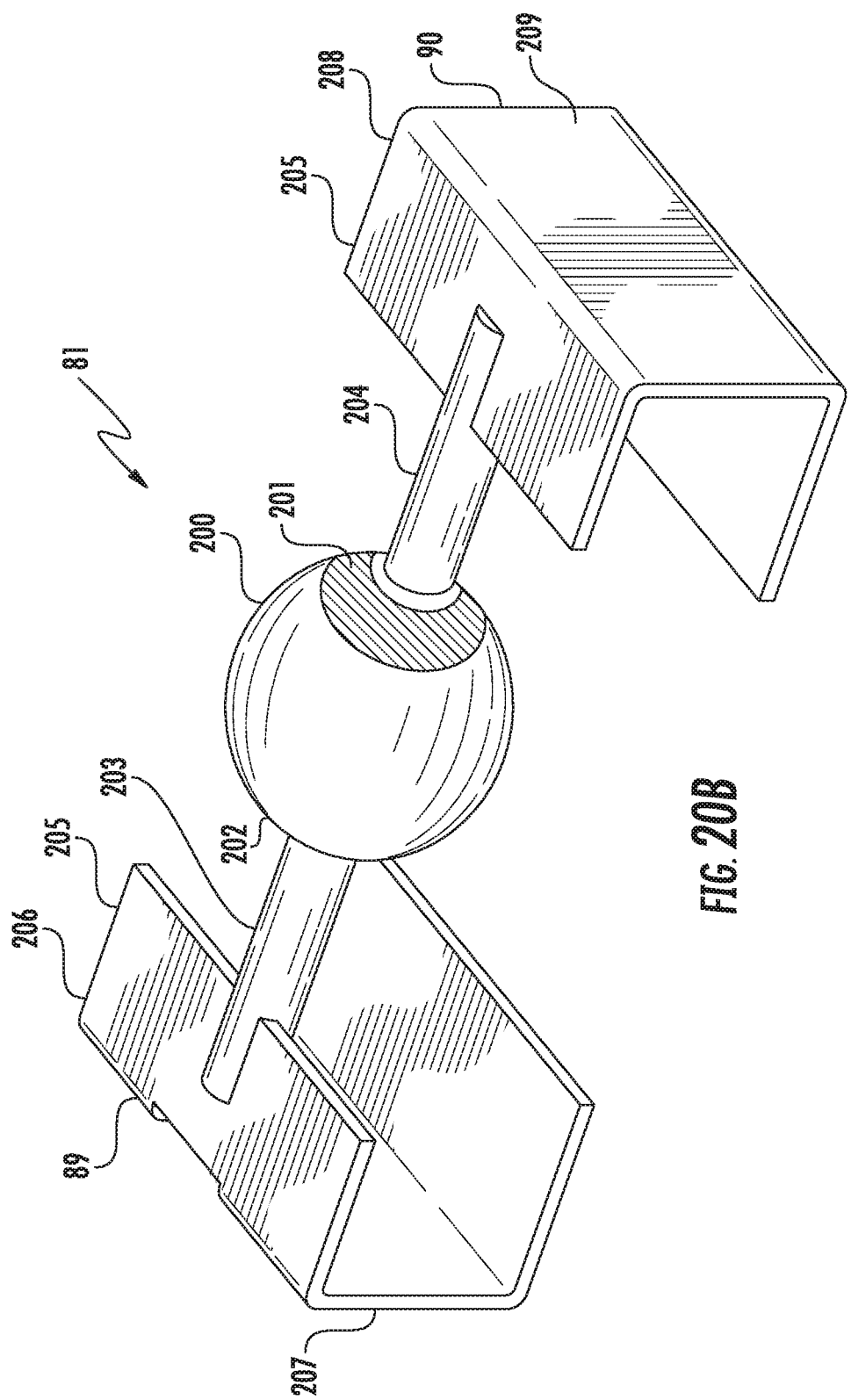
FIG. 20B shows a front side top perspective view of the diode attached to a lead frame of FIG. 20A.
Figure 21D:
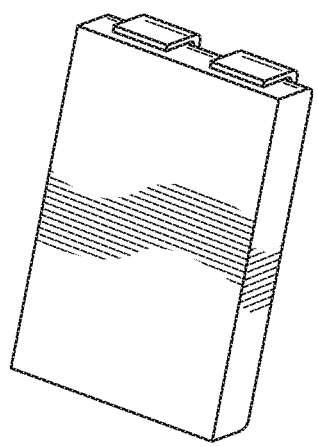
FIGS. 21A-21H show exemplary electrical components with molded bodies having flat surfaces from various angles.
Figure 21H:
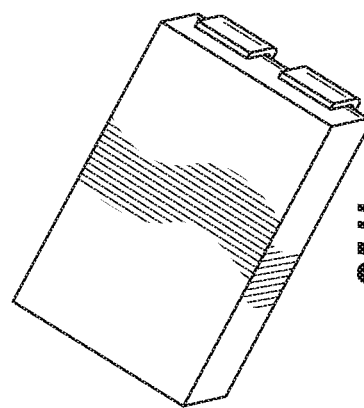
Figure 21C:
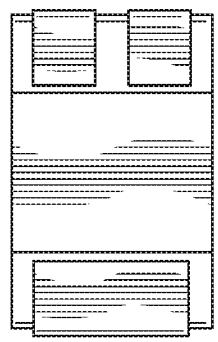
Figure 21G:
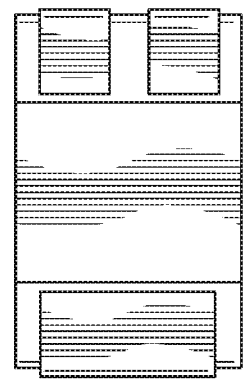
Figure 21B:
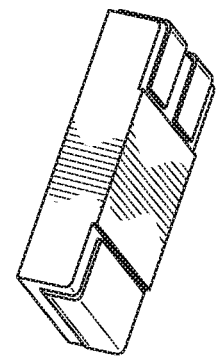
Figure 21F:
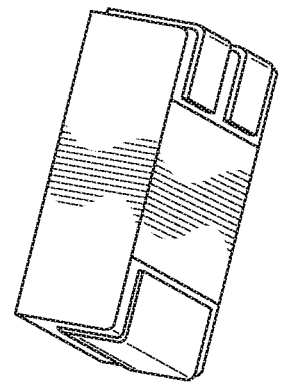
Figure 21A:
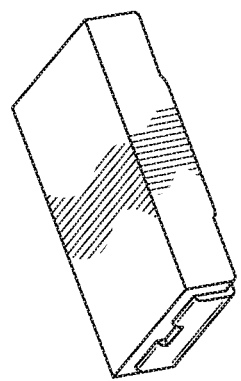
Figure 21E:
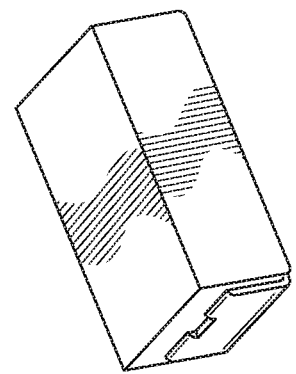

FIGS. 20A and 20B show a diode 200 having a cathode end 201 and an anode end 202. A first plated lead 203 and a second plated lead 204 extend axially from opposite ends of the diode 200. The leads 203, 204 are welded or soldered to the lead frame 205, with the lead frame having a first portion 206 with first lead 207, and a second portion 208 with a second lead 209. The ribbed molded body 82 is then molded around the diode 200 and lead frame 205, leaving the first lead 207 and second lead 209 exposed, so that the leads can be bent along the sides and bottom surface of the ribbed molded body 82 to form surface mount terminals.

While active two terminal electrical components are shown in FIGS. 19A-20B, it will be appreciated that a three terminal active electrical component such as a high voltage FET or IGBT could be packaged with a ribbed molded body according to the present invention. In addition, multiple electrical components could be housed within a ribbed molded body according to the teachings of the invention. Thus, a ribbed molded body according to the teachings of the present invention could house, for example, multiple diodes in a package with three or more leads.

Figure 22:
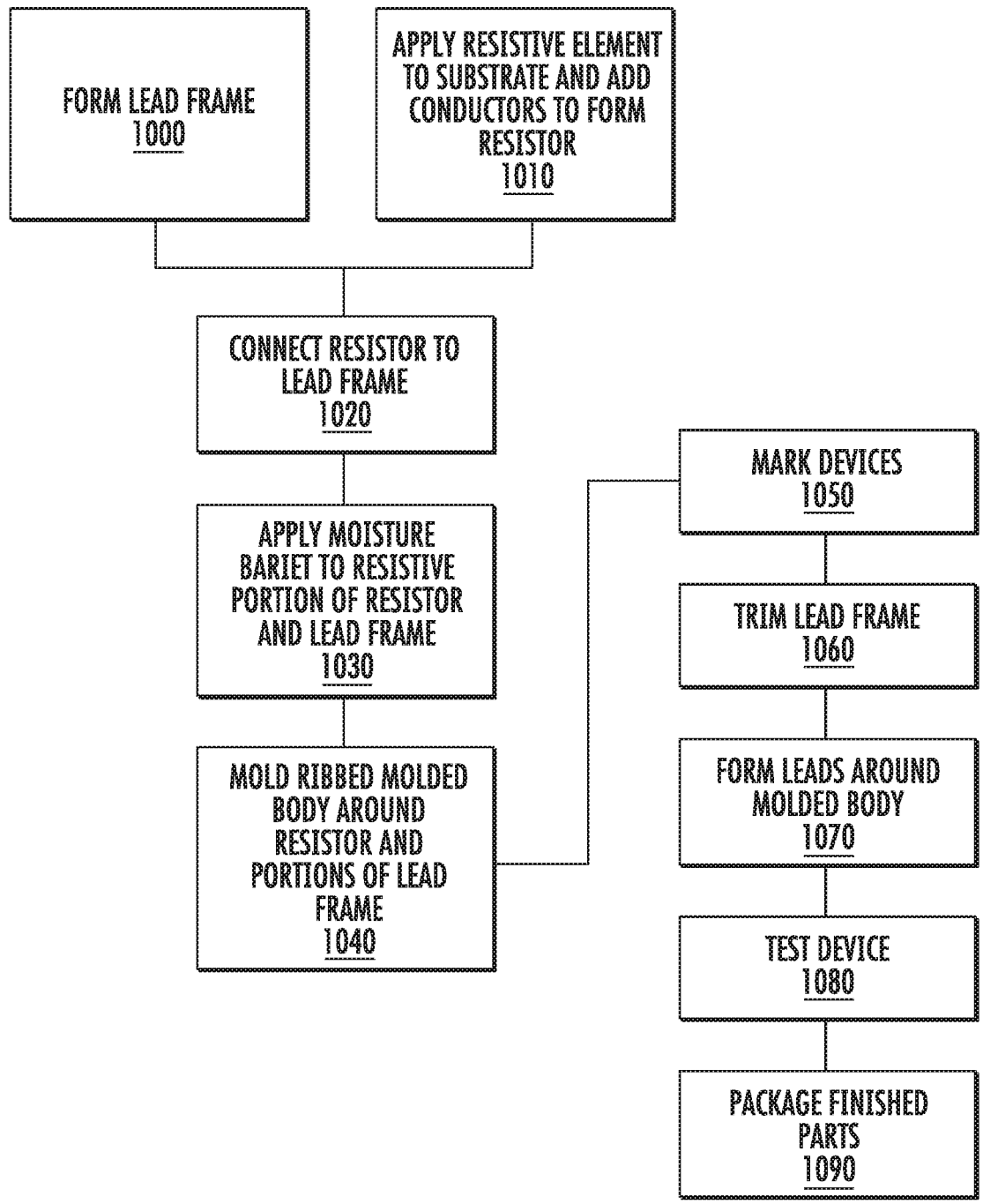
FIG. 22 is a flow-chart showing an illustrative manufacturing process for an embodiment of an electrical component having a ribbed molded body according to the present invention.

The formation of an electrical component having a ribbed molded body according to the invention to form a molded device will now be described using a passive component as an example, with reference to FIG. 22. A molded passive component according to the present invention and functioning as a voltage divider may be formed as follows. A lead frame is stamped and formed into the desired configuration (1000). A thick (e.g., VISHAY® chip dividers model parts CDHV or CDMV) or thin film divider may be used as a resistive element. This resistive element includes a serpentine resistor (high voltage resistor) connected to a block resistor (low voltage resistor) and is configured as a voltage divider. The resistive material is either a thick film resistor (printed) or a thin film resistor (sputtered and patterned) on a ceramic substrate with either thick film printed and/or sputtered conductors (1010). This resistor is then connected to the lead frame, such as by soldering the resistor into the stamped and formed lead frame (1020). A moisture barrier may be applied to the mounted resistor and lead frame to cover the resistive portion (1030). The electrical component assembly may also be pre-molded or coated before it is over-molded with the ribbed molded body. A ribbed molded body comprising a surface with a plurality of ribs is then molded around the assembly (1040). After molding, the devices are marked (1050), the lead frame is trimmed (1060), the leads are formed around the molded body (1070), and the devices are electrically tested (1080). As a final step, the finished parts are packaged (1090).

It will be appreciated that the foregoing is presented by way of illustration only and not by way of any limitation. It is contemplated that various alternatives and modifications may be made to the described embodiments without departing from the spirit and scope of the invention. Having thus described the present invention in detail, it is to be appreciated and will be apparent to those skilled in the art that many physical changes, only a few of which are exemplified in the detailed description of the invention, could be made without altering the inventive concepts and principles embodied therein. It is also to be appreciated that numerous embodiments incorporating only part of the preferred embodiment are possible which do not alter, with respect to those parts, the inventive concepts and principles embodied therein. The present embodiment and optional configurations are therefore to be considered in all respects as exemplary and/or illustrative and not restrictive, the scope of the invention being indicated by the appended claims rather than by the foregoing description, and all alternate embodiments and changes to this embodiment which come within the meaning and range of equivalency of said claims are therefore to be embraced therein.

What is claimed is:

1. An electrical device for high voltage applications, comprising:
   an electrical component connected to a first lead and a second lead;
   a molded body comprising a top surface and an opposite bottom surface, a front surface and an opposite back surface, a left side surface and an opposite right side surface;
   the molded body comprising a first non-ribbed area, a second non-ribbed area, and a ribbed portion comprising ribs extending between the first non-ribbed area and the second non-ribbed area, the molded body formed around the electrical component and portions of the first lead and the second lead and leaving exposed portions of the first lead and the second lead;

an exposed portion of the first lead extending from the left side surface of the molded body and bent so as to be positioned along a bottom surface of the first non-ribbed area as a first surface mount lead; and an exposed portion of the second lead extending from the right side surface of the molded body and bent so as to be positioned along a bottom surface of the second non-ribbed area as a second surface mount lead;

wherein the ribbed portion is formed on a surface selected from the group consisting of the bottom surface, front surface and back surface, and wherein the top surface is generally flat.

2. The electrical device of claim 1, wherein at least a portion of the ribs have a top wall defining the bottom surface, front surface or back surface, and wherein the top surface does not include any top wall of the ribs.

3. The electrical device of claim 1, further comprising a third lead connected to the same side of the electrical component as the second lead.

4. The electrical device of claim 3, wherein the first lead extends from the left side surface and the second lead and the third lead extend from the right side surface.

5. The electrical device of claim 2, wherein at least a portion of the bottom surface comprises a plurality of ribs between the first non-ribbed portion and the second non-ribbed portion.

6. The electrical device of claim 5, wherein at least a portion of the front surface comprises a plurality of ribs between the first non-ribbed portion and the second non-ribbed portion.

7. The electrical device of claim 6, wherein at least a portion of the back surface comprises a plurality of ribs between the first non-ribbed portion and the second non-ribbed portion.

8. The electrical device of claim 7, wherein at least some of the ribs extend along the front surface, bottom surface, and back surface.

9. The electrical device of claim 1, wherein an indentation forming a channel is provided in a surface between at least two adjacent ribs of the ribbed portion, and wherein the top surface does not include the indentation.

10. The electrical device of claim 1, wherein the electrical device is a passive component or an active component.

11. The electrical device of claim 10, wherein the electrical device is a passive component comprising a resistor, an inductor, a capacitor or a chip divider.

12. The electrical device of claim 10, wherein the electrical device is an active component comprising a diode, semiconductor, rectifier, transistor, or integrated circuit.

13. The electrical device of claim 1, wherein the ribbed portion is configured to increase a surface distance between the first lead and the second lead.

14. A method of making an electrical device for high voltage applications, comprising the steps of:

connecting an electrical component to a first lead and a second lead;

forming a molded body comprising a first non-ribbed area, a second non-ribbed area, and a ribbed portion comprising ribs extending between the first non-ribbed area and the second non-ribbed area around the electrical component and portions of the first lead and the second lead and leaving exposed portions of the first lead and the second lead, the molded body comprising a top surface and an opposite bottom surface, a front surface and an opposite back surface, a left side surface and an opposite right side surface;

extending an exposed portion of the first lead from the left side surface of the molded body and bending the exposed portion of the first lead so as to be positioned along a bottom surface of the first non-ribbed area to form a first surface mount lead; and extending an exposed portion of the second lead from the right side surface of the molded body and bending the exposed portion of the second lead so as to be positioned along a bottom surface of the second non-ribbed area to form a second surface mount lead;

wherein the ribbed portion is formed on a surface selected from the group consisting of the bottom surface, front surface and back surface, and wherein the top surface is generally flat.

15. The method of claim 14, wherein at least a portion of the ribs have a top wall defining the bottom surface, front surface or back surface, and wherein the top surface does not include any top wall of the ribs.

16. The method of claim 15, wherein at least some of the ribs extend along the front surface, bottom surface, and back surface.

17. The method of claim 14, wherein an indentation forming a channel is provided in a surface between at least two adjacent ribs of the ribbed portion, and wherein the top surface does not include the indentation.

18. The method of claim 15, wherein at least a portion of the bottom surface comprises a plurality of ribs between the first non-ribbed portion and the second non-ribbed portion.

19. The method of claim 14, wherein the electrical device is a passive component or an active component.

20. The method of claim 14, wherein the ribbed portion is configured to increase the surface distance between the first lead and the second lead.

* * * * *